United States Patent
Sakuma et al.

(10) Patent No.: US 9,293,470 B2
(45) Date of Patent: Mar. 22, 2016

(54) NON-VOLATILE SEMICONDUCTOR MEMORY DEVICE

(71) Applicant: Kabushiki Kaisha Toshiba, Minato-ku (JP)

(72) Inventors: Haruka Sakuma, Yokkaichi (JP); Kiwamu Sakuma, Yokkaichi (JP); Masahiro Kiyotoshi, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/491,107

(22) Filed: Sep. 19, 2014

(65) Prior Publication Data
US 2015/0200200 A1 Jul. 16, 2015

(30) Foreign Application Priority Data
Jan. 16, 2014 (JP) ................................ 2014-005526

(51) Int. Cl.
*H01L 27/115* (2006.01)
*H01L 27/02* (2006.01)
(Continued)

(52) U.S. Cl.
CPC ...... *H01L 27/11578* (2013.01); *H01L 27/1157* (2013.01); *H01L 29/4234* (2013.01); *H01L 29/66833* (2013.01); *H01L 29/792* (2013.01)

(58) Field of Classification Search
CPC ... H01L 27/115; H01L 29/788; H01L 27/088; H01L 23/48; H01L 29/78; H01L 29/66; H01L 29/79
USPC .......... 257/324, 314, 316, 326, 327, 329, 335
See application file for complete search history.

(56) References Cited

U.S. PATENT DOCUMENTS 8,008,732 B2 8/2011 Kiyotoshi et al.
8,030,700 B2 10/2011 Sakamoto
(Continued)

FOREIGN PATENT DOCUMENTS

JP 2008-78404 A 4/2008
JP 2009-27136 A 2/2009
(Continued)

OTHER PUBLICATIONS

A. Hubert et al., "A Stacked SONOS technology, up to 4 Levels and 6nm Crystalline Nanowires, with Gate-all-around or Independent Gates (Φ-Flash), Suitable for Full 3D Integration", IEDM, 2009, pp. 637-640.
(Continued)

*Primary Examiner* — Chuong A Luu
(74) *Attorney, Agent, or Firm* — Oblon, McClelland, Maier & Neustadt, L.L.P.

(57) ABSTRACT

Stack structures are arranged in a first direction horizontal to a semiconductor substrate, one of which has a longitudinal direction along a second direction. One stack structure has a plurality of semiconductor layers stacked between interlayer insulating layers. A memory film is formed on side surfaces of the stack structures and includes a charge accumulation film of the memory cell. Conductive films are formed on side surfaces of the stack structures via the memory film. One stack structure has a shape increasing in width from above to below in a cross-section including the first and third directions. One conductive film has a shape increasing in width from above to below in a cross-section including the second and third directions. Predetermined portions in the semiconductor layers have different impurity concentrations between upper and lower semiconductor layers.

18 Claims, 19 Drawing Sheets

(51) Int. Cl.
*H01L 29/423* (2006.01)
*H01L 29/66* (2006.01)
*H01L 29/792* (2006.01)

(56) References Cited

U.S. PATENT DOCUMENTS

| | | |
|---|---|---|
| 8,441,061 B2 | 5/2013 | Nakao et al. |
| 8,513,725 B2 | 8/2013 | Sakuma et al. |
| 8,779,495 B2 | 7/2014 | Happ et al. |
| 2010/0034028 A1* | 2/2010 | Katsumata et al. ...... 365/185.28 |
| 2010/0078701 A1* | 4/2010 | Shim et al. .................. 257/314 |
| 2010/0171162 A1* | 7/2010 | Katsumata et al. ........... 257/314 |
| 2010/0207193 A1* | 8/2010 | Tanaka et al. ................ 257/324 |
| 2010/0226195 A1 | 9/2010 | Lue |
| 2011/0284946 A1 | 11/2011 | Kiyotoshi et al. |
| 2012/0068254 A1 | 3/2012 | Sakuma et al. |
| 2012/0068354 A1* | 3/2012 | Tanaka et al. ................ 257/774 |
| 2012/0280303 A1 | 11/2012 | Kiyotoshi et al. |
| 2013/0015519 A1 | 1/2013 | Fujii et al. |
| 2013/0175490 A1 | 7/2013 | Kusai et al. |

FOREIGN PATENT DOCUMENTS

| | | |
|---|---|---|
| JP | 2009-238874 A | 10/2009 |
| JP | 2010-34112 A | 2/2010 |
| JP | 2011-60991 A | 3/2011 |
| JP | 2012-69603 A | 4/2012 |
| JP | 2012-69604 A | 4/2012 |
| JP | 2012-234980 A | 11/2012 |
| JP | 2013-26289 A | 2/2013 |
| WO | WO 2011/114502 A1 | 9/2011 |

OTHER PUBLICATIONS

Chang-Hyun Lee et al., "Highly Scalable NAND Flash Memory with Robust Immunity to Program Disturbance Using Symmetric Inversion-Type Source and Drain Structure", IEEE, Symposium on VLSI Technology Digest of Technical Papers, 2008, pp. 118-119.

* cited by examiner

NON-VOLATILE SEMICONDUCTOR MEMORY DEVICE

CROSS REFERENCE TO RELATED APPLICATIONS

This application is based on and claims the benefit of priority from prior Japanese Patent Application No. 2014-5526, filed on Jan. 16, 2014, the entire contents of which are incorporated herein by reference.

FIELD

The embodiments described below relate to a non-volatile semiconductor memory device.

BACKGROUND

In recent years, for a more integrated memory cell, a non-volatile semiconductor memory device including a three dimensional structure has been proposed. By way of example, a non-volatile semiconductor memory device of a three dimensional structure having a fin-type stack structure is known.

However, in the non-volatile semiconductor memory device of a three dimensional structure, a plurality of memory cells stacked therein generally have different dimensions, film thicknesses, shapes or the like, which results in a problem that the memory cells in the stacking direction have different characteristics.

DETAILED DESCRIPTION

A non-volatile semiconductor memory device according to embodiments described below comprises a semiconductor substrate, a plurality of stack structures arranged in a first direction horizontal to a surface of the semiconductor substrate. This stack structure has a longitudinal direction, the longitudinal direction being a second direction horizontal to the surface of the semiconductor substrate and crossing the first direction. One stack structure has a plurality of semiconductor layers functioning as a memory cell, the semiconductor layers being stacked between interlayer insulating layers in a third direction perpendicular to the first and second direction. A memory film is formed on side surfaces on the first direction of the stack structures, the memory film comprising a charge accumulation film of the memory cell. Conductive films are formed on side surfaces on the first direction of the stack structures via the memory film, the conductive films functioning as control electrodes of the memory cell. One stack structure has a shape increasing in width from a side away from the semiconductor substrate to the semiconductor substrate in a cross-section comprising the first and third directions. One conductive film has a shape increasing in width from the side away from the semiconductor substrate to the semiconductor substrate in a cross-section comprising the second and third directions. Predetermined portions in the semiconductor layers have different impurity concentrations between upper and lower semiconductor layers.

With reference to drawings, a non-volatile semiconductor memory device according to the embodiments will be described below.

[First Embodiment]

Figure 1A:
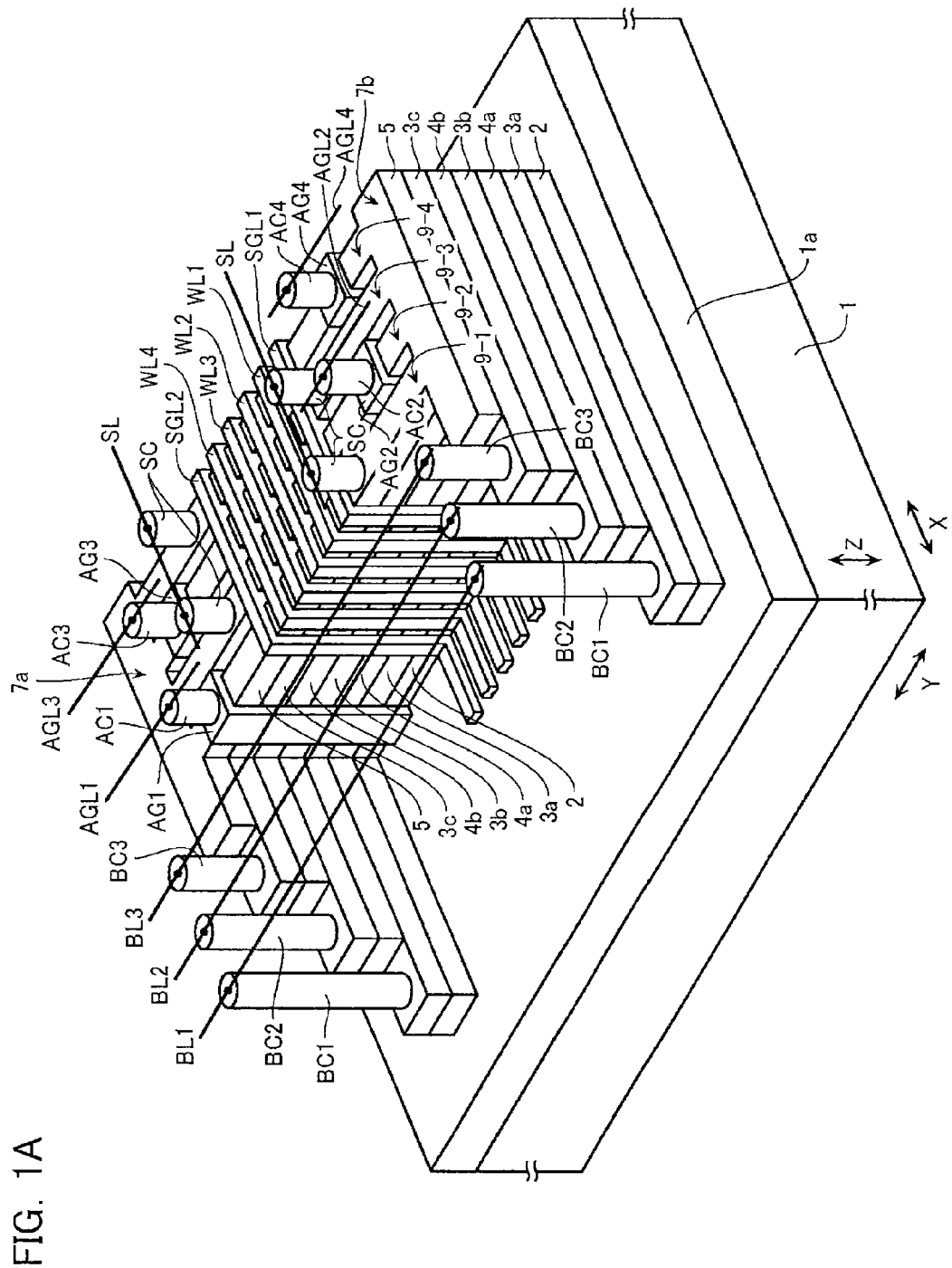
FIG. 1A is a perspective view showing a schematic configuration of a non-volatile semiconductor memory device according to a first embodiment.
Figure 1B:
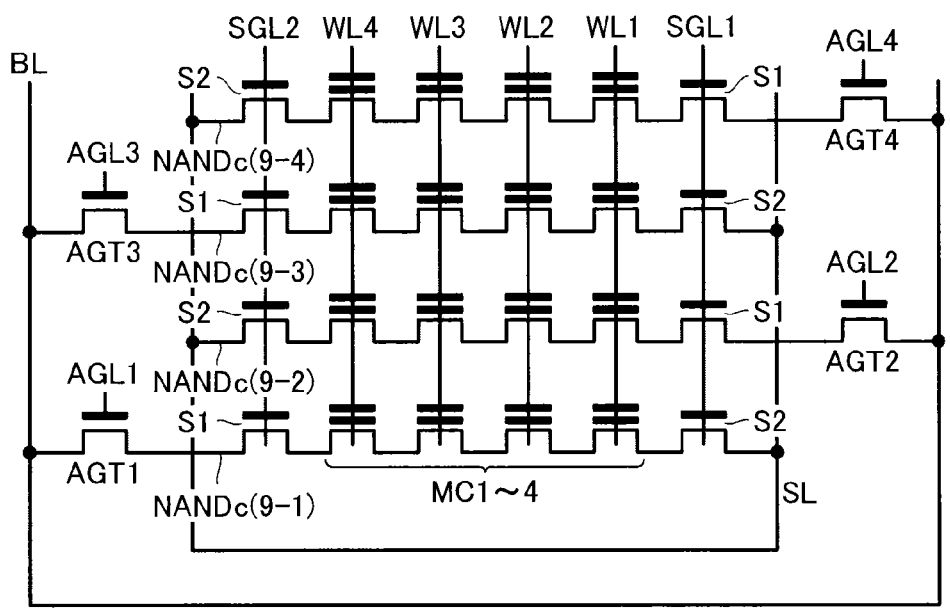
FIG. 1B is an equivalent circuit diagram of the memory cell array of the non-volatile semiconductor memory device according to the first embodiment.
Figure 2:
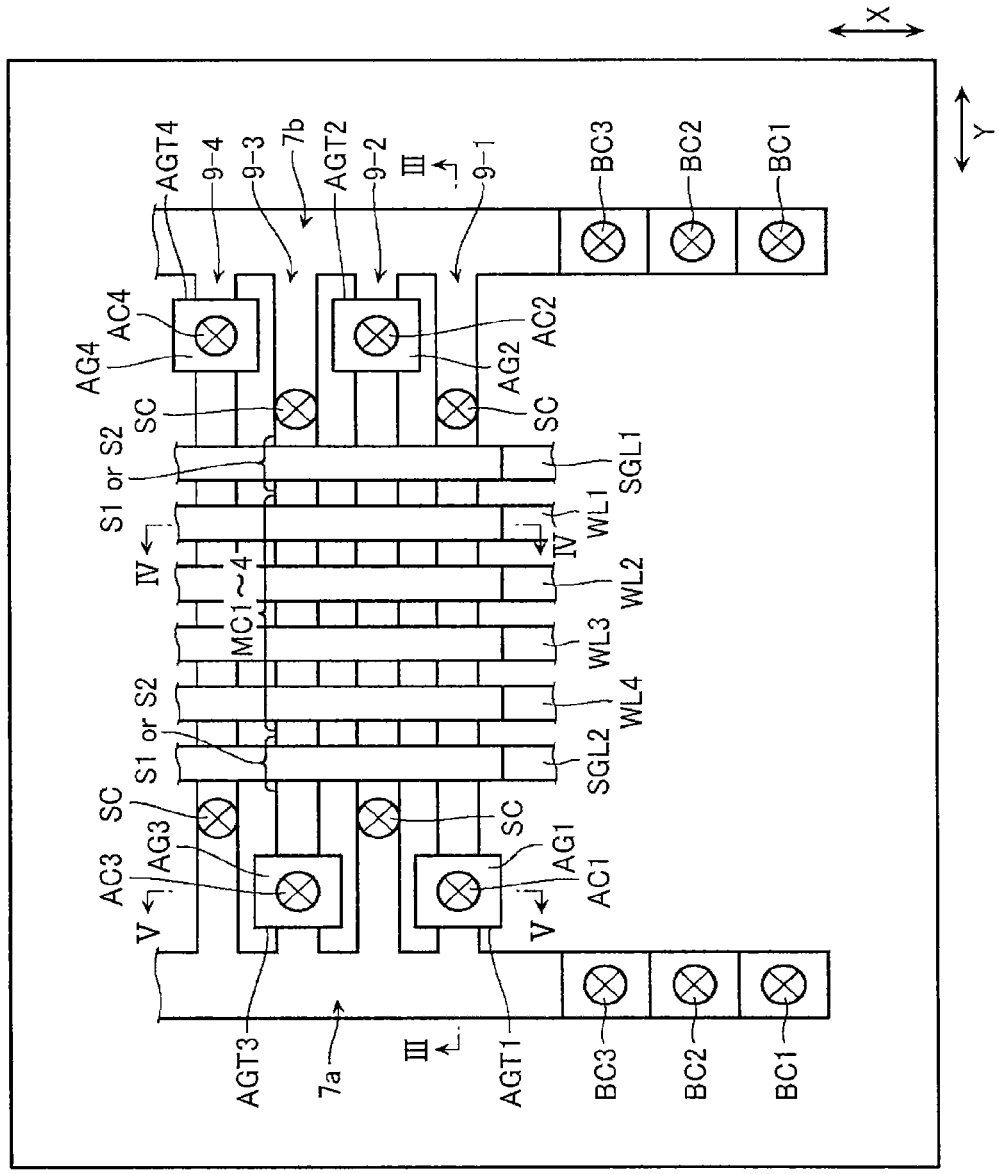
FIG. 2 is a top view showing a schematic configuration of the non-volatile semiconductor memory device according to the first embodiment.
Figure 3:
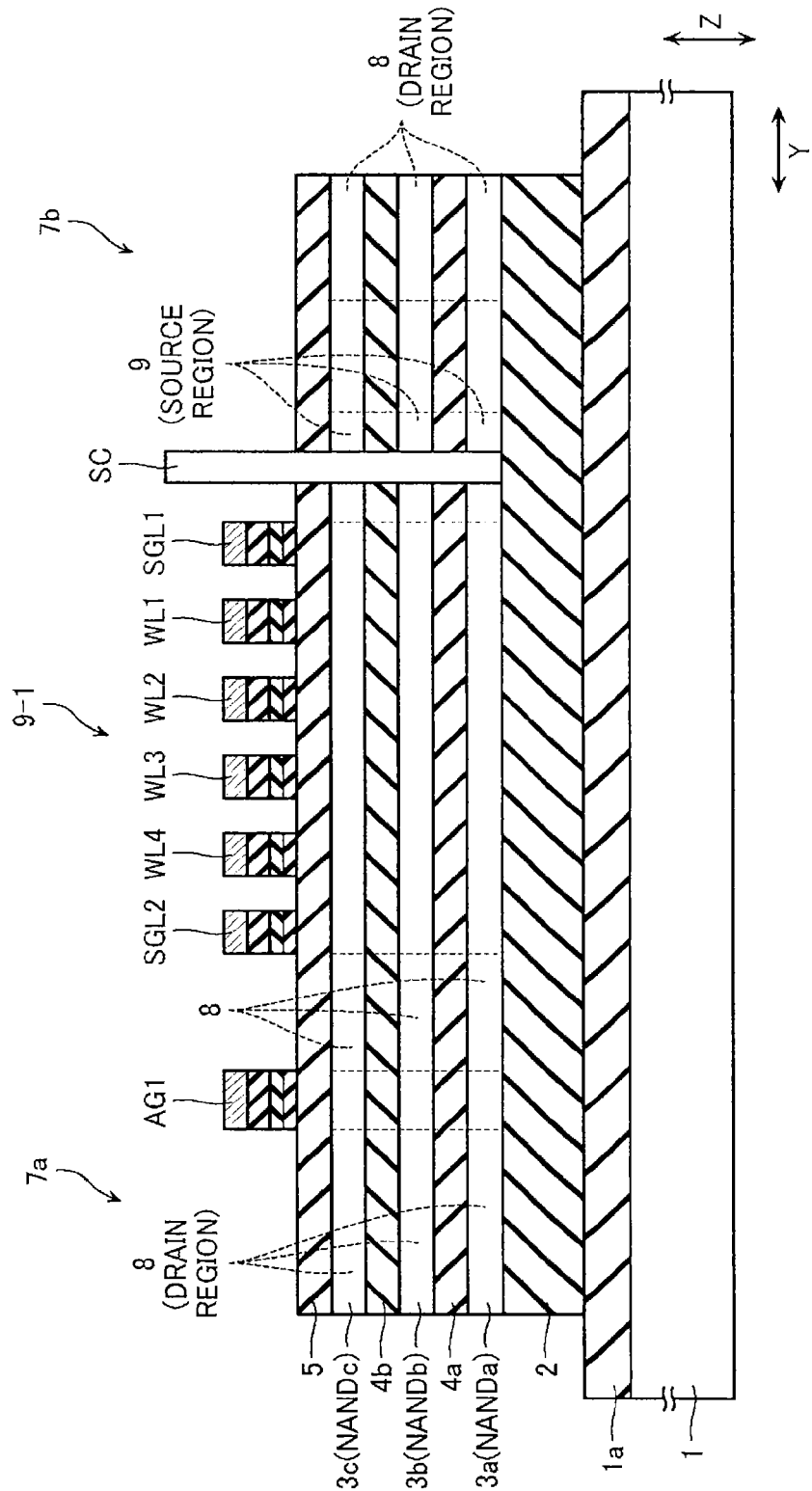
FIG. 3 is a cross-sectional view along the Y-axis direction of the non-volatile semiconductor memory device according to the first embodiment.
Figure 4:
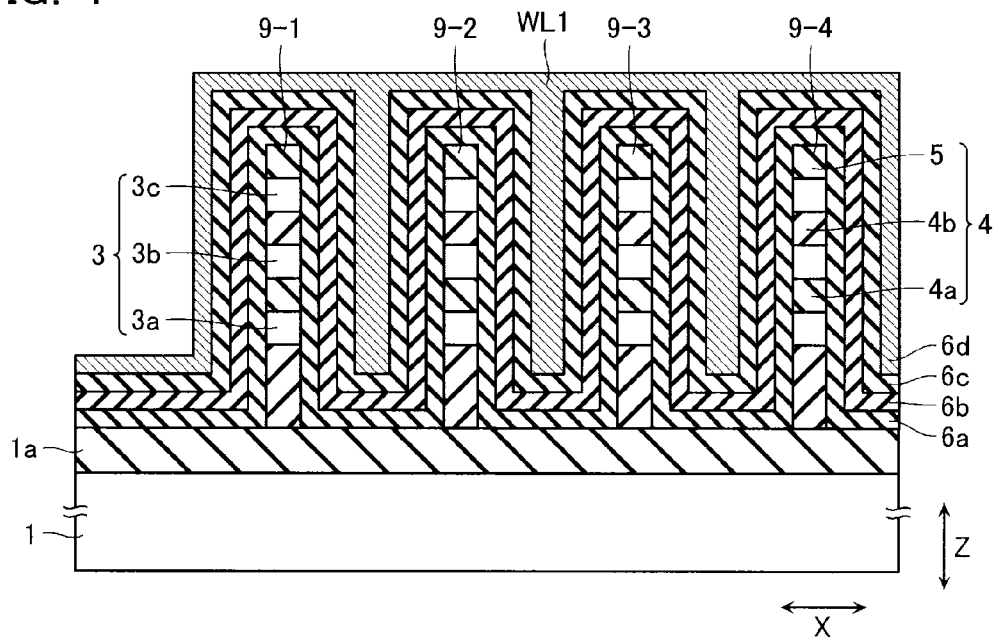
FIG. 4 is a cross-sectional view along the X-axis direction of the non-volatile semiconductor memory device according to the first embodiment.
Figure 5:
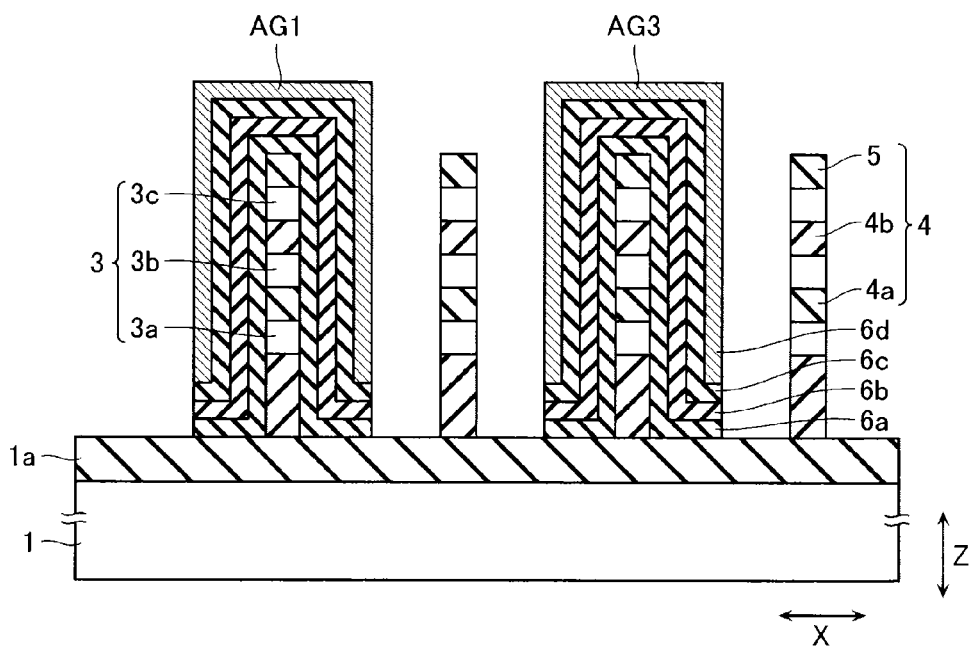
FIG. 5 is a cross-sectional view along the X-axis direction of the non-volatile semiconductor memory device according to the first embodiment.

First, with reference to FIG. 1A to FIG. 5, a non-volatile semiconductor memory device according to a first embodiment will be described. FIG. 1A is a perspective view of the non-volatile semiconductor memory device. FIG. 1B is an equivalent circuit diagram of a memory cell array in one layer. FIG. 2 is a plan view of FIG. 1A. FIG. 3 is a cross-sectional view along the III-III line in FIG. 2. FIG. 4 is a cross-sectional view along the IV-IV line in FIG. 2. FIG. 5 is a cross-sectional view along the V-V line in FIG. 2.

FIG. 1A to FIG. 5 are schematic diagrams for understanding a schematic configuration of the device in this embodiment and not intended to show the accurate shape, dimension, ratio, or the like of each element. These figures are for easy understanding of the entire configuration of each element, and the shape, dimension, ratio, or the like of each element may be changed as appropriate. As described below, in the non-volatile semiconductor memory device according to this embodiment, conductive layers forming a bit-line BL and word lines WL have a so-called taper shape, but in FIG. 4 and FIG. 5, for simplicity of the figure, these conductive layers are shown to have a rectangular shape.

Also, in the cross-sectional views in FIG. 4 and FIG. 5, the X-axis width of each of fin-type stack structures 9-1 to 9-4 forming a memory cell array is set to about four times the X-axis distance between the fin-type stack structures 9-1 to 9-4. Note, however, that the X-axis distance and width of the fin-type stack structures 9-1 to 9-4 may be set to be the same.

First, with reference to FIG. 1A, a schematic configuration of the non-volatile semiconductor memory device of the first embodiment will be described. With reference to FIG. 1A, the non-volatile semiconductor memory device comprises a semiconductor substrate 1 such as a silicon substrate. The non-volatile semiconductor memory device also comprises the fin-type stack structures 9-1 to 9-4 via a device separation insulating layer 1a on the semiconductor substrate 1. The fin-type stack structures 9-1 to 9-4 form a memory cell array. Each of the fin-type stack structures 9-1 to 9-4 comprises a plurality of memory strings of a NAND flash memory and forms the body portion of a memory cell.

The non-volatile semiconductor device comprises, in addition to the fin-type stack structures 9-1 to 9-4, word lines WL1 to WL4, select gate lines SGL1 to SGL2, bit-lines BL1 to BL3, a source line SL, and assist gate lines AGL1 to AGL4, all of which together form a three dimensional shaped NAND flash memory. FIG. 1 shows a group of fin-type stack structures 9-1 to 9-4. A set of plural groups may form one block of a memory cell array.

With reference to FIG. 1A and FIG. 2, the fin-type stack structures 9-1 to 9-4 extend in the Y-axis direction horizontal to the substrate 1 and are arranged at a predetermined pitch in the X-axis direction. Also, with reference to FIG. 3, each of the fin-type stack structures 9-1 to 9-4 has a structure comprising a stack of plural (three in this example) memory strings NANDa, NANDb, and NANDc. Specifically, each of the fin-type stack structures 9-1 to 9-4 comprises semiconductor layers $3a$, $3b$, and $3c$ that function as the respective body portions of the memory strings NANDa, NANDb, and NANDc, and interlayer dielectric films 2, $4a$, $4b$, and 5 between which the semiconductor layers $3a$, $3b$, and $3c$ are formed (see FIG. 3).

With reference to FIG. 1B, an equivalent circuit of a memory string will be described. FIG. 1B shows an equivalent circuit diagram of the top-layer memory string NANDc. The other memory strings NANDa and NANDb have the same circuitry. Each of the memory strings NANDa, NANDb, and NANDc comprises a plurality of memory cells MC1 to MC4 connected in series in the Y-axis direction, drain-side select gate transistors S1 disposed on the drain sides of the memory cells MC1 to MC4, source-side select gate transistors S2 disposed on the source sides of the memory cells MC1 to MC4, and assist gate transistors AGT. The assist gate transistors AGT are transistors provided to select any one of the four fin-type stack structures 9-1 to 9-4.

Although FIG. 1A to FIG. 5 show examples where the four fin-type stack structures 9-1 to 9-4 are formed on the substrate 1, the invention is not limited thereto. The number of fin-type stack structures may be n (n is a natural number of two or more).

Also, although FIG. 1A to FIG. 5 show examples where one fin-type stack structure 9-$i$ ($i=1$ to 4) has three memory strings NANDa, NANDb, and NANDc, the number of memory strings in one fin-type stack structure is not limited thereto and may be two, four, or more.

With reference to FIG. 1A and FIG. 2, the fin-type stack structures 9-1 to 9-4 have first end portions in the Y-axis direction commonly connected via a first conductive portion $7a$. Also, the fin-type stack structures 9-1 to 9-4 have second end portions in the Y-axis direction commonly connected via a second conductive portion $7b$. The first conductive portion $7a$ and the second conductive portion $7b$ may be configured to have the same stack structure as the fin-type stack structures 9-1 to 9-4.

The memory strings NANDa, NANDb, and NANDc in the odd-numbered fin-type stack structures 9-1 and 9-3 are commonly connected to the first conductive portion $7a$. Each memory string has the first conductive portion $7a$ as a drain-region-side end portion and the second conductive portion $7b$ as a source-region-side end portion.

Meanwhile, the memory strings NANDa, NANDb, and NANDc in the even-numbered fin-type stack structures 9-2 and 9-4 are commonly connected to the first conductive portion $7a$. Each memory string has the first conductive portion $7a$ as a source-region-side end portion and the second conductive portion $7b$ as a drain-region-side end portion.

Note that the source regions of the memory strings NANDa, NANDb and NANDc in the odd-numbered fin-type stack structures 9-1 and 9-3 are electrically isolated from the second conductive portion $7b$. Likewise, the source regions of the memory strings NANDa, NANDb, and NANDc in the even-numbered fin-type stack structures 9-2 and 9-4 are electrically isolated from the first conductive portion $7a$.

Each of the memory strings NANDa, NANDb, and NANDc comprises a plurality of memory cells MC connected in series in the Y-axis direction, source-side select gate transistors S2 disposed on the source sides of the memory cells MC, drain-side select gate transistors S1 disposed on the drain sides of the memory cells MC, and assist gate transistors AGT disposed between the drain-side select gate transistors S1 or the source-side select gate transistors S2 and the first conductive portion $7a$ or the second conductive portion $7b$.

Also, the non-volatile semiconductor memory device comprises a plurality of word lines WL and select gate lines SGL1 and SGL2, which are disposed crossing the fin-type stack structures 9-1 to 9-4. The memory cells MC are formed in the crossing portions of the word lines WL and the fin-type stack structures 9-1 to 9-4. Also, in the crossing portions of the select gate line SGL1 or SGL2 and the fin-type stack structures 9-1 to 9-4, the drain-side select gate transistors S1 and the source-side select gate transistors S2 are formed.

Specifically, the word lines WL1 to WL4 in this embodiment each have a comb-blade shape, and the comb-blade portions extending in the Z axial direction as the longitudinal direction are each configured to get into the gaps between the fin-type stack structures 9-1 to 9-4. The comb-blade portion of each word line WL is formed to be in touch with any of the fin-type stack structures 9-1 to 9-4 via a memory film (a tunnel insulating film, a memory film, or a block insulating film) not-shown in FIG. 1A.

The above first conductive portion 7a and the second conductive portion 7b function as conductive portions to electrically connect the memory strings to the bit-lines BL. With reference to FIG. 1A, the first and second conductive portions 7a and 7b each have step-shaped end portions connected to the bit-lines BL1 to BL3 via contact plugs BC1 to BC3, respectively.

Also, each of the fin-type stack structures 9-1 to 9-4 is connected to, at one end thereof, source line contacts SC, and connected to, via the source line contacts SC, a source line SL. The source line contacts SC are connected to, in the even-numbered fin-type stack structures 9-2 and 9-4, the end portions on the first conductive portion 7a side. The source line contacts SC are also connected to, in the odd-numbered fin-type stack structures 9-1 and 9-3, the end portions on the second conductive portion 7b side.

Also, in the non-volatile semiconductor device of the first embodiment, each of the memory strings NANDa to NANDc in the fin-type stack structures 9-1 to 9-4 comprises the assist gate transistors AGT formed therein. The assist gate transistors AGT are transistors to selectively connect any one of the fin-type stack structures 9-1 to 9-4 to the first conductive portion 7a or the second conductive portion 7b.

The assist gate transistors AGT comprise respective assist gate electrodes AG1 to AG4 that serve as their gate electrodes. The assist gate electrodes AG1 to AG4 are connected to assist gate lines AGL1 to AGL4 via contact plugs AC1 to AC4, respectively.

With reference to FIG. 2, in the even-numbered fin-type stack structures 9-2 and 9-4, the contact plugs AC2 and AC4 are connected to the respective fin-type stack structures 9-2 and 9-4 at the end portions on the second conductive portion 7b side, and in the odd-numbered fin-type stack structures 9-1 and 9-3, the contact plugs AC1 and AC3 are connected to the respective fin-type stack structures 9-1 and 9-3 at the end portions on the first conductive portion 7a side.

With reference next to FIG. 4, a specific structure of each memory cell MC will be described.

Each memory cell MC comprises the semiconductor layers 3a, 3b, and 3c that function as the body portion (channel portion) of the memory cell MC and a gate stack structure disposed on the X-axis direction side surfaces of the semiconductor layers 3a, 3b, and 3c. The gate stack structure comprises a first insulating layer 6a, a charge accumulation layer 6b, a second insulating layer 6c, and an electrode layer 6.

The first insulating layer 6a functions as a tunnel insulating film of the memory cell MC. The charge accumulation layer 6b is a film that comprises, for example, a silicon nitride film (SiN). The charge accumulation layer 6b has a function of accumulating charges and holds data on the basis of the amount of accumulated charges. Then, the second insulating layer 6c is formed between the charge accumulation layer 6b and the electrode layer 6d and functions as a block insulating film of the memory cell MC. The electrode layer 6d functions as a control gate electrode (control electrode) and the word lines WL of the memory cell MC. The electrode layer 6d, which functions as the word lines WL, has a comb-blade shape in the X-Z plane and is formed to cause the comb-blade portions to get into the space between the fin-type stack structures 9-1 to 9-4, as described above. The electrode layer 6d also functions as the selection gate electrodes SGL1 and SGL2 of the drain-side select gate transistor and the source-side select gate transistor, respectively. Note, however, that the drain-side select gate transistor and the source-side select gate transistor may have a different structure from the memory cell MC. For example, the select gate transistor may have the MIS (Metal/Insulator/Semiconductor) structure, which only has one insulating layer and the electrode layer 6d.

Each assist gate transistor AGT also has, like the memory cell MC, the semiconductor layers 3a, 3b, and 3c and the gate stack structure disposed on the X-axis direction side surfaces of the semiconductor layers 3a, 3b, and 3c. The gate stack structure comprises the first insulating layer 6a, the charge accumulation layer 6b, the second insulating layer 6c, and the electrode layer 6d. The first insulating layer 6a functions as the gate insulating layer. The electrode layer 6d functions as one of the assist gate electrodes AG1 to AG4. Note, however, that each assist gate transistor AGT may have a different structure from the memory cell MC. For example, each assist gate transistor AGT may have the MIS structure, which only has a gate insulating layer and an assist gate electrode on the gate insulating layer.

The assist gate electrodes AG1 to AG4 are electrically independent from each other. And the assist gate electrodes AG1 to AG4 are connected to the assist gate lines AGL1 to AGL4 via the contact plugs AC1 to AC4, respectively. The assist gate electrodes AG1 to AG4 are electrically independent from each other because, as described above, the assist gate transistors AG1 to AG4 need to have a function of selecting one of the fin-type stack structures 9-1 to 9-4.

Note that an impurity region (for example, an n-type diffusion layer) 8 is provided in the regions in the semiconductor layers 3a, 3b, and 3c in the fin-type stack structures 9-1 to 9-4 where the assist gate transistors AGT are formed. The n-type diffusion layer 8 functions as the source region and the drain region of each assist gate transistor AGT. Note that the impurity region 8 is also provided in the semiconductor layers (3a, 3b, and 3c) in the first conductive portion 7a and the second conductive portion 7b.

Note that in the examples of FIG. 1A to FIG. 5, the electrode layer 6d is formed to cover both the side surfaces of the fin-type stack structures 9-1 to 9-4, and thus the memory cells MC1 to MC4, the drain-side select gate transistors S1, the source-side select gate transistors S2, and the assist gate transistors AGT1 to AGT4 have the so-called double gate structure. However, the gate structure is not limited to those shown in the figures, and it may comprise, for example, the single gate structure in which the electrode layer 6d is formed only on one side surface of the fin-type stack structures 9-1 to 9-4.

Also in the examples of FIG. 1A to FIG. 5, between the set of memory cells MC1 to MC4, the drain-side select gate transistors S1, the source-side select gate transistors S2, and the assist gate transistors AGT1 to AGT4, the first insulating layer 6a, the charge accumulation layer 6b, the second insulating layer 6c, and the electrode layer 6d are each divided in the Y-axis direction. However, the first insulating layer 6a, the charge accumulation layer 6b, and the second insulating layer 6c may be integrated (continuous) between the set of memory cells MC1 to MC4, the drain-side select gate transistors S1, the source-side select gate transistors S2, and the assist gate transistors AGT1 to AGT4. The electrode layer 6d needs to be electrically divided between the set of memory cells MC1 to MC4, the drain-side select gate transistors S1, the source-side select gate transistors S2, and the assist gate transistors AGT1 to AGT4.

Meanwhile, the assist gate transistors AGT1 to AGT4 are disposed at, in the odd-numbered fin-type stack structures 9-1 and 9-3, the end portions on the first conductive portion 7a side, and in the even-numbered fin-type stack structures 9-2 and 9-4, the end portions on the second conductive portion 7b side. Specifically, when viewed as the whole memory cell array, at the end portions on the first conductive portion 7a side of the fin-type stack structures 9-1 to 9-4, the assist gate transistors AGT are disposed in the X-axis direction on every other of the fin-type stack structures 9-1 to 9-4. Likewise, at the end portions of the second conductive portion 7b side of the fin-type stack structures 9-1 to 9-4, the assist gate transistors AGT are disposed in the X-axis direction on every other of the fin-type stack structures 9-1 to 9-4. According to this structure, the pitch (or distance) in the X-axis direction of the fin-type stack structures 9-1 to 9-4 may be decreased to contribute to further high integration.

Also, the source regions of the memory strings NANDa, NANDb, and NANDc comprise impurity regions (for example, n-type diffusion layers) 9 in the semiconductor layers 3a, 3b, and 3c. The impurity regions 9 as the source regions are connected to the source line SL via the contact plugs SC.

Here, the source regions of the memory strings NANDa, NANDb, and NANDc are disposed on the memory cells MC1 to MC4 sides of the line joining the assist gate electrodes AG1 to AG4 in the X-axis direction. This is to reduce, when patterning the assist gate electrodes AG1 to AG4, damage applied to the source region 9 due to misalignment.

[Material Examples]

For the materials of the elements of the non-volatile semiconductor memory devices shown in FIG. 1A to FIG. 5, the optimum materials may be selected as appropriate depending on the generation of the semiconductor memories.

For example, the first interlayer dielectric film 2 comprises silicon dioxide ($SiO_2$). The semiconductor layers 3a, 3b, and 3c comprise, for example, single crystal silicon (Si). The semiconductor layers 3a, 3b, and 3c are preferably in the single crystal state, but maybe in the amorphous state, the polycrystalline state, or the like.

The interlayer dielectric films 4a and 4b comprise, for example, silicon dioxide ($SiO_2$). The interlayer dielectric film 5 may comprise, for example, silicon dioxide ($SiO_2$) or silicon nitride ($SiN_x$) alone, or may comprise a stack structure thereof.

The memory strings NANDa, NANDb, and NANDc comprise memory cells of the SONOS (silicon/oxide/nitride/oxide/silicon) structure.

The first insulating layer 6a may be silicon dioxide ($SiO_2$), the charge accumulation layer 6b may be $Si_3N_4$, the second insulating layer 6c may be $Al_2O_3$, and the control gate electrode 6d may be NiSi.

The first insulating layer 6a may comprise silicon oxynitride, a stack structure of silicon dioxide and silicon nitride, or the like. Also, the first insulating layer 6a may comprise silicon nanoparticles, metal ions, or the like.

The charge accumulation layer 6b may comprise at least one of silicon-rich SiN, SixNy in which the composition ratio x and y of silicon and nitrogen is arbitrary, silicon oxynitride (SiON), aluminium oxide ($Al_2O_3$), aluminium oxynitride (AlON), hafnia ($HfO_2$), hafnium aluminate ($HfAlO_3$), nitride hafnia (HfON), nitrided hafnium aluminate (HfAlON), hafnium silicate (HfSiO), nitrided hafnium silicate (HfSiON), lanthanum oxide ($La_2O_3$), and lanthanum aluminate ($LaAlO_3$).

The charge accumulation layer 6b may comprise silicon nanoparticles, metal ions, or the like. Also, the charge accumulation layer 6b may comprise an electrical conductor such as polysilicon, metal, or the like with impurities added thereto.

The second insulating layer 6c may comprise at least one of silicon dioxide ($SiO_2$), silicon oxynitride (SiON), aluminium oxide ($Al_2O_3$), aluminium oxynitride (AlON), hafnia ($HfO_2$), hafnium aluminate ($HfAlO_3$), nitride hafnia (HfON), nitrided hafnium aluminate (HfAlON), hafnium silicate (HfSiO), nitrided hafnium silicate (HfSiON), lanthanum oxide ($La_2O_3$), lanthanum aluminate ($LaAlO_3$), and lanthanum aluminum silicate (LaAlSiO).

The electrode layer 6d may comprise a metal compound such as tantalum nitride (TaN), tantalum carbide (TaC), or titanium nitride (TiN), a metal element showing metallic electrical conduction properties such as nickel (Ni), vanadium (V), chromium (Cr), mangan (Mn), yttrium (Y), molybdenum (Mo), ruthenium (Ru), rhodium (Rh), hafnium (Hf), tantalum (Ta), tungsten (W), iridium (Ir), cobalt (Co), titanium (Ti), erbium (Er), platinum (Pt), palladium (Pd), zirconium (Zr), gadolinium (Gd), dysprosium (Dy), holmium (Ho), or erbium (Er), and silicide thereof.

Also, the impurities included in the impurity regions 8 and 9 may comprise n-type semiconductor impurities including quinquevalent elements such as arsenic (As) and phosphorus (P), p-type semiconductor impurities including three valent elements such as boron (B) and indium (In), and combinations thereof.

The contact plugs BC1, BC2, and BC3, AC1 to AC4, and SC, the bit-lines BL1, BL2, and BL3, the assist gate lines AGL1 to AGL4, and the source line SL may comprise metal materials such as tungsten (W), copper (Cu), and aluminum (Al).

Also, the contact plugs BC1, BC2, and BC3, AC1 to AC4, and SC, the bit-lines BL1, BL2, and BL3, the assist gate lines AGL1 to AGL4, and the source line SL may all comprise the same material or may comprise different materials according to the desired resistivity. Note, however, that the bit-lines BL1 to BL3 and the assist gate lines AGL1 to AGL4 preferably comprise the same material because they may be formed in the same wiring layer.

[Operation]

Next, an example of operations (a write operation, an erase operation, and a read operation) of the non-volatile semiconductor memory device of the first embodiment will be described.

(Write Operation)

An example of the write operation will be described. Here, a description is given of an example where the memory strings NANDa, NANDb, and NANDc in the fin-type stack structure 9-1 are selected at the same time and subjected to the write operation.

First, with the potentials of the bit-lines BL1, BL2, and BL3 and the source line SL set to the ground potential (0 V), all word lines WL1 to WL4 are applied with a first positive bias V1 (for example about 6 to 8 V). Thus, an n-type accumulation region is formed in the semiconductor layers 3a, 3b, and 3c, which are intended for the channels of the memory strings NANDa, NANDb, and NANDc.

Also, the potential of the assist gate line AGL1 is set to, for example, "H" to render the assist gate transistor AGT1 in the first fin-type stack structure 9-1 conductive (ON). Note that the potentials of the other assist gate lines AGL2 to AGL4 remain at, for example, "L," and thus the assist gate transistors AGT2 to AGT4 in the fin-type stack structures 9-2 to 9-4 are rendered non-conductive (OFF).

Here, "H" means the potential for turning on the transistor, and "L" means the potential for turning off the transistor. This holds true in the following discussion.

Then, the word line WL-select of the selected memory cell to be written is applied with, for example, a second positive bias V2 (for example, about 20 V) that is higher than the first positive bias. Also, the voltages of the bit-lines BL1, BL2, and BL3 are set to the power supply voltage Vdd or the ground potential depending on data to be written.

In the memory strings NANDa, NANDb, and NANDc in the fin-type stack structures 9-2 to 9-4, the assist gate transistors AGT2 to AGT4 are in non-conductive state, and thus application of the second positive bias V2 will still allow the channel potentials of the memory strings NANDa, NANDb, and NANDc to increase by capacitive coupling. Therefore, a sufficiently large voltage necessary for writing is not applied between the control gate electrode (or the charge accumulation layer) and the channel, thus inhibiting the writing.

Meanwhile, in the memory strings NANDa, NANDb, and NANDc in the fin-type stack structure 9-1, the assist gate transistor AGT1 is in conductive state (ON), and thus a potential depending on data to be written is transferred to the semiconductor layers 3a, 3b, and 3c. If the write data is "0," for example, the channel is set to a predetermined positive potential. In this condition, application of the second positive bias V2 on the control gate electrode of the selected memory cell MC will increase the channel potential by capacitive coupling, thus making the drain-side select gate transistor S1 in the cut-off state. Therefore, in the memory string to which a potential according to the write data "0" is transferred, the channel potential is increased by capacitive coupling caused by the application of the second positive bias V2. Specifically, a sufficiently large voltage necessary for writing is not applied between the control gate electrode (or the charge accumulation layer) and the channel, thus injecting no electrons into the charge accumulation layer. Specifically, the writing is inhibited ("0"-programming).

In contrast, if the write data is "1," for example, the channel is the ground potential (0 V). In this condition, application of the second positive bias V2 on the control gate electrode of the selected memory cell will not make the drain-side select gate transistor S1 in the cut-off state. Therefore, in the memory string to which the potential corresponding to write data "1" is transferred, a sufficiently large voltage necessary for writing is generated between the control gate electrode (or the charge accumulation layer) and the channel, thus injecting electrons into the charge accumulation layer. Specifically, the writing is performed ("1"-programming).

(Erase Operation)

Next, an example of the erase operation will be described.

The erase operation may be performed, for example, to the memory strings NANDa, NANDb, and NANDc in one or more selected fin-type stack structures 9-i at the same time.

First, the bit-lines BL1, BL2, and BL3 and the source line SL are applied with the ground potential (0 V) and the select gate lines SGL1 and SGL2 and the word lines WL1 to WL4 are applied with a first negative bias V1'. Then, a p-type accumulation region is formed in the semiconductor layers 3a, 3b, and 3c, which are the channels of the memory strings NANDa, NANDb, and NANDc.

Also, the potentials of the assist gate lines AGL corresponding to one or more fin-type stack structures to be erased are set to, for example, "H", thus rendering the corresponding assist gate transistors AGT conductive (ON). Then, all word lines WL1 to WL4 are applied with a second negative bias V2' higher than the first negative bias V1'.

As a result, a sufficiently large voltage necessary for erasing is generated between the control gate electrode (or the charge accumulation layer) and the channel, thus discharging electrons in the charge accumulation layer into the channel. The erasing is thus performed.

(Read Operation)

Next, the read operation will be described. Here, a description is given of an example where the memory strings NANDa, NANDb, and NANDc in the fin-type stack structure 9-l are selected and these memory strings are subjected to the read operation at the same time.

First, the bit-lines BL1, BL2, and BL3 are connected to a not-shown sense amplifier circuit and the source line SL is applied with the ground potential (0 V). Also, the potential of the assist gate line AGL1 is set to, for example, "H" to render the assist gate transistor AGT1 in the fin-type stack structure 9-1 conductive (ON). Note that the potentials of the other assist gate lines AGL2 to AGL4 are maintained at, for example, "L," thus rendering the assist gate transistors AGT2 to AGT4 in the fin-type stack structures 9-2 to 9-4 non-conductive (OFF).

Also, the select gate lines SGL1 and SGL2 and the word lines WL1 to WL4 are applied with a first positive bias Vread. The first positive bias Vread should be a value to render the memory cell MC conductive regardless of data held in the memory cell MC.

Then, for the memory strings NANDa, NANDb, and NANDc, data is sequentially read in the direction from the source-region side memory cell MC1 to the drain-region side memory cell MC4.

In the selected memory cell MC to be read, the control gate electrode is applied with a second positive bias Vr for reading that is lower than the first positive bias Vread. The second positive bias Vr is, for example, an intermediate voltage of a plurality of threshold voltage distributions.

Depending on the value of data stored in the selected memory cell, the conductive or non-conductive state of the selected memory cell is determined. The sense amplifier circuit may be used to detect the potential changes of the bit-lines BL1, BL2, and BL3, the current changes through the bit-lines BL1, BL2, and BL3, or the like to carry out the reading.

[Manufacturing Method]

Figure 6:
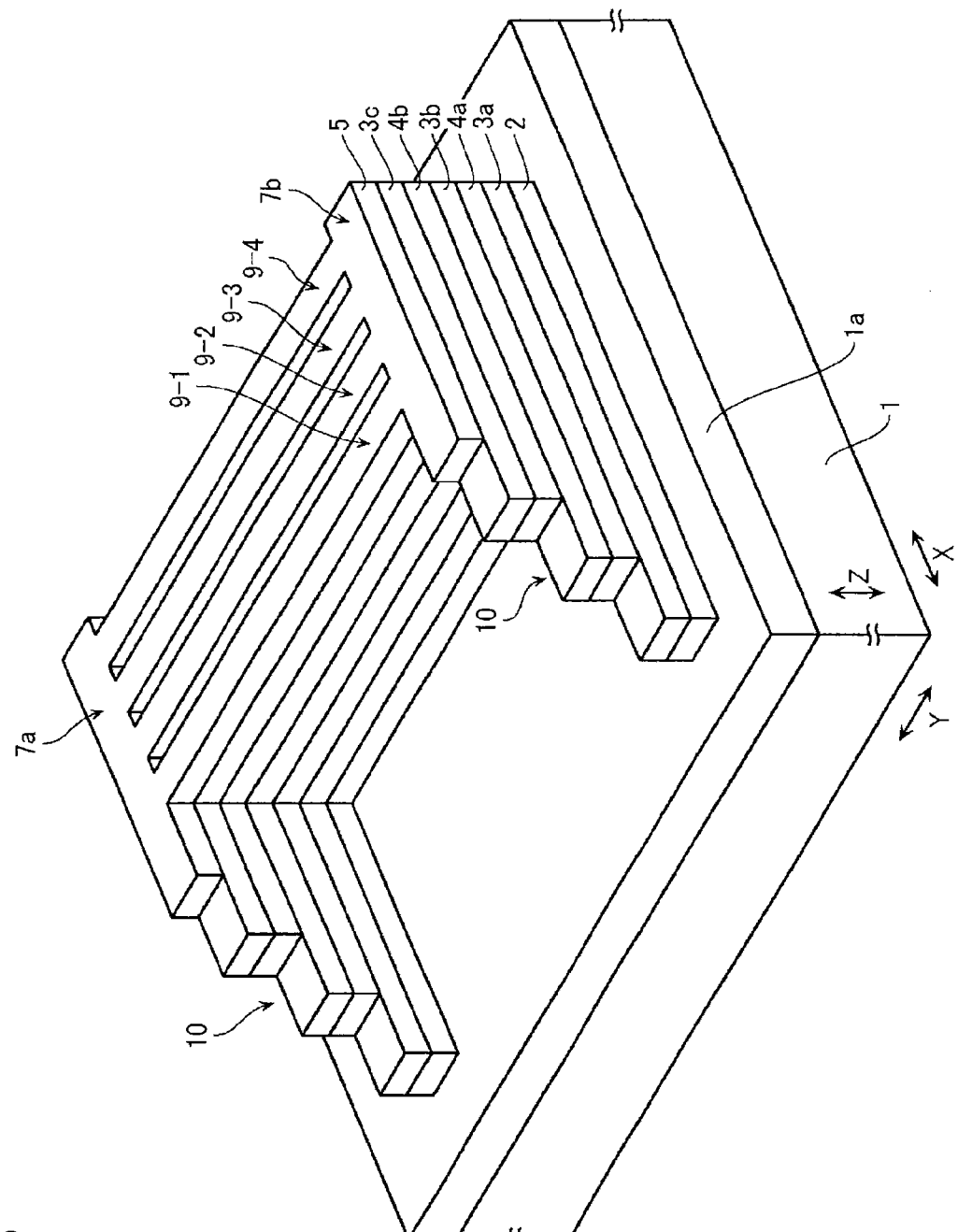
FIG. 6 is a process chart showing a method of manufacturing the non-volatile semiconductor memory device according to the first embodiment.
Figure 7:
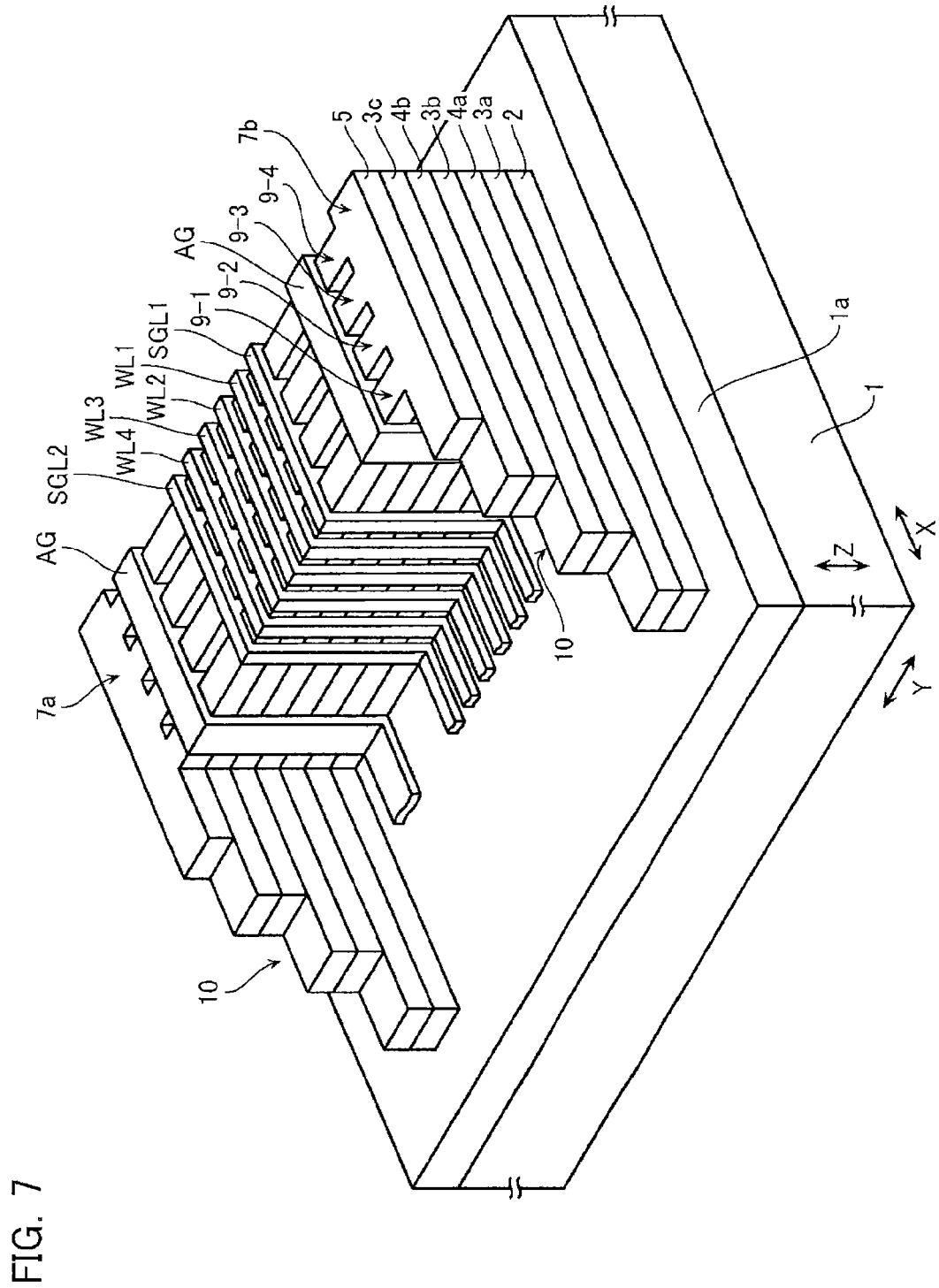
FIG. 7 is a process chart showing a method of manufacturing the non-volatile semiconductor memory device according to the first embodiment.
Figure 8:
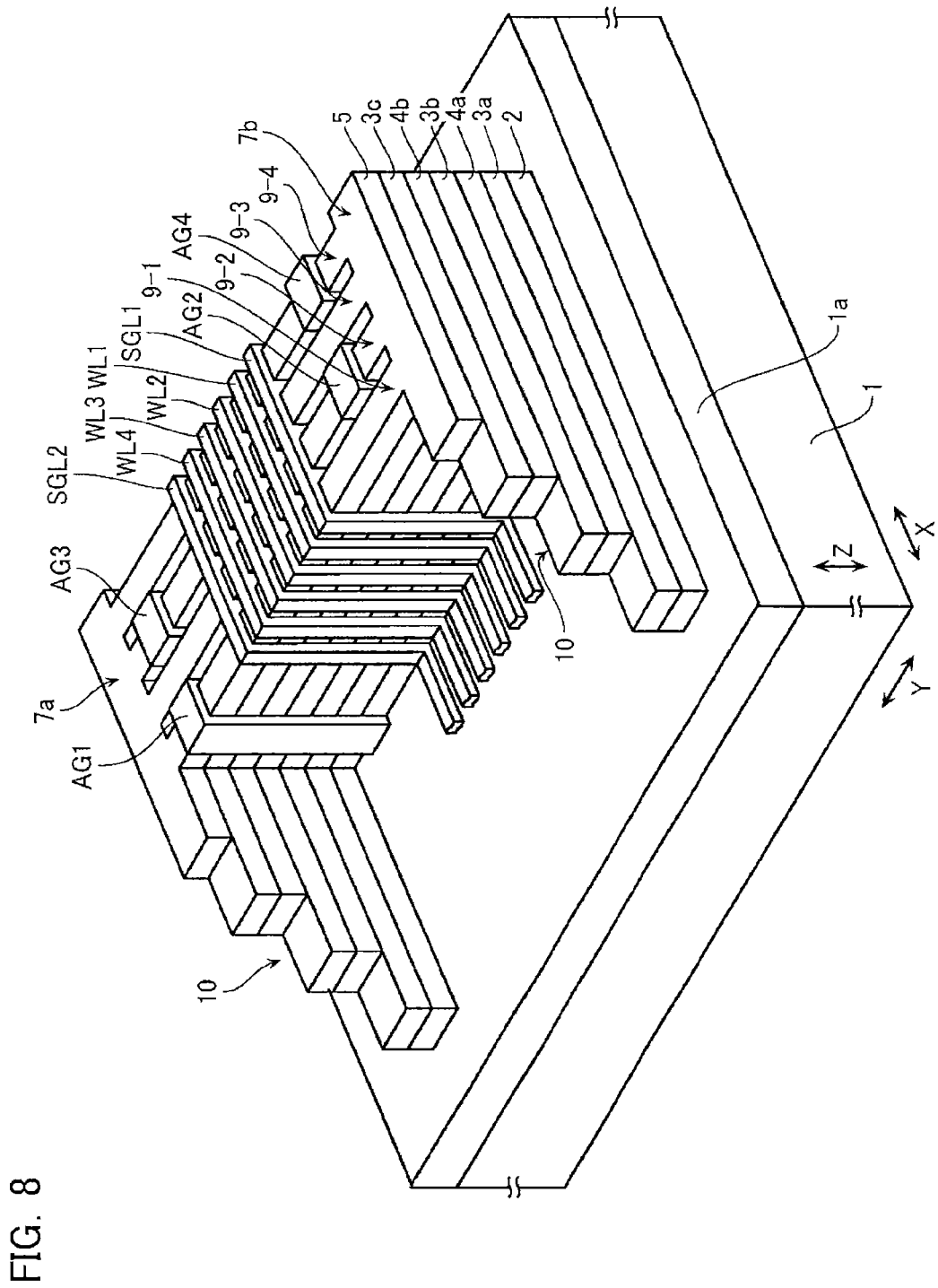
FIG. 8 is a process chart showing a method of manufacturing the non-volatile semiconductor memory device according to the first embodiment.

With reference next to FIG. 6 to FIG. 8, a method of manufacturing the memory cell array portion of the non-volatile semiconductor memory devices shown in FIG. 1A to FIG. 5 will be described.

First, with reference to FIG. 6, on the semiconductor substrate 1, the device separation insulating layer 1a is formed, and then the interlayer dielectric films 2, 4a, 4b, and 5 and the semiconductor layers 3a to 3c are deposited in the order shown in FIG. 6. Then, the photolithography and etching technologies are used to process the interlayer dielectric films 2, 4a, 4b, and 5 and the semiconductor layers 3a to 3c to form the above fin-type stack structures 9-1 to 9-4, the first conductive portion 7a, the second conductive portion 7b, and the step portion 10. Note that the step portion 10 may be formed by gradually etching back a not-shown resist.

With reference now to FIG. 7, the first insulating layer 6a, the charge accumulation layer 6b, the second insulating layer 6c, and the electrode layer 6, as the gate stack structure, are deposited in this order on the entire surface including the surfaces of the fin-type stack structures 9-1 to 9-4, and then the photolithography and etching technologies are used to process the first insulating layer 6a, the charge accumulation layer 6b, the second insulating layer 6c, and the electrode layer 6 to form the word lines WL1 to WL4, the select gate lines SGL1 to SGL2, and the assist gate electrodes AG.

Next, the photolithography and etching technologies are used again to etch the assist gate electrodes AG as shown in FIG. 8, thus making the assist gate electrodes AG1 to AG4 in the fin-type stack structures 9-1 to 9-4 electrically independent from one another. Then, although not shown in the figures, an interlayer dielectric film is deposited on the structure in FIG. 8 and then a large number of holes are formed passing through the interlayer dielectric film to form the contact plugs BC1 to BC3 that reach the semiconductor layers 3a to 3c in the step portion 10. Likewise, the contact plugs AC1 to AC4 are formed on the assist gate electrodes AG1 to AG4 and the contact plugs SC are formed on the source region.

Then, the bit-lines BL1, BL2, and BL3 are formed on the contact plugs BC1, BC2, and BC3, the assist gate lines AGL1 to AGL4 are formed on the contact plugs AC1 to AC4, and in addition, the source line SL is formed on the contact plugs SC. According to the above steps, the structures in FIG. 1A to FIG. 5 are completed.

Figure 9:
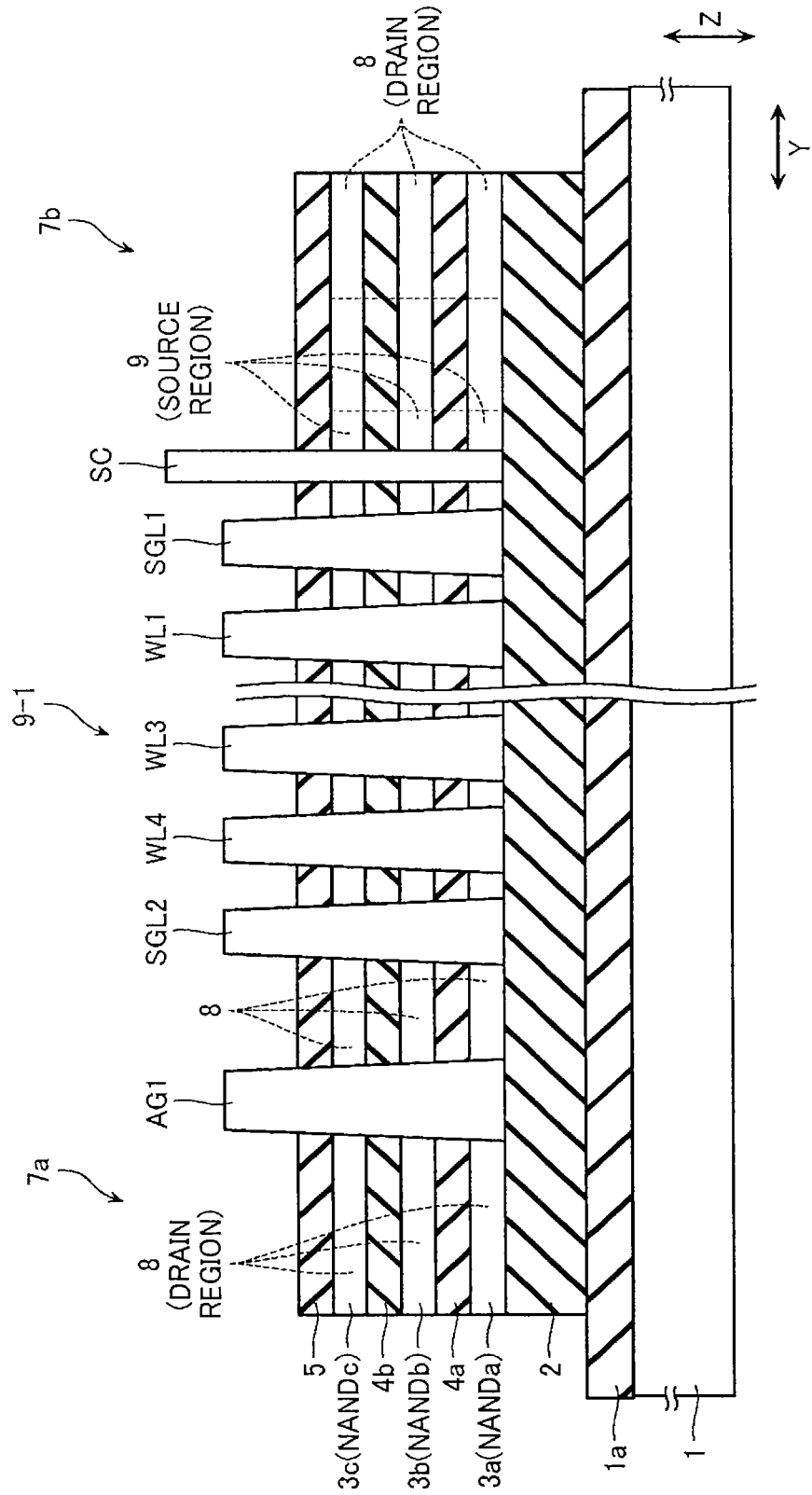
FIG. 9 is a cross-sectional view along the Y-axis direction of the non-volatile semiconductor memory device according to the first embodiment.
Figure 10:
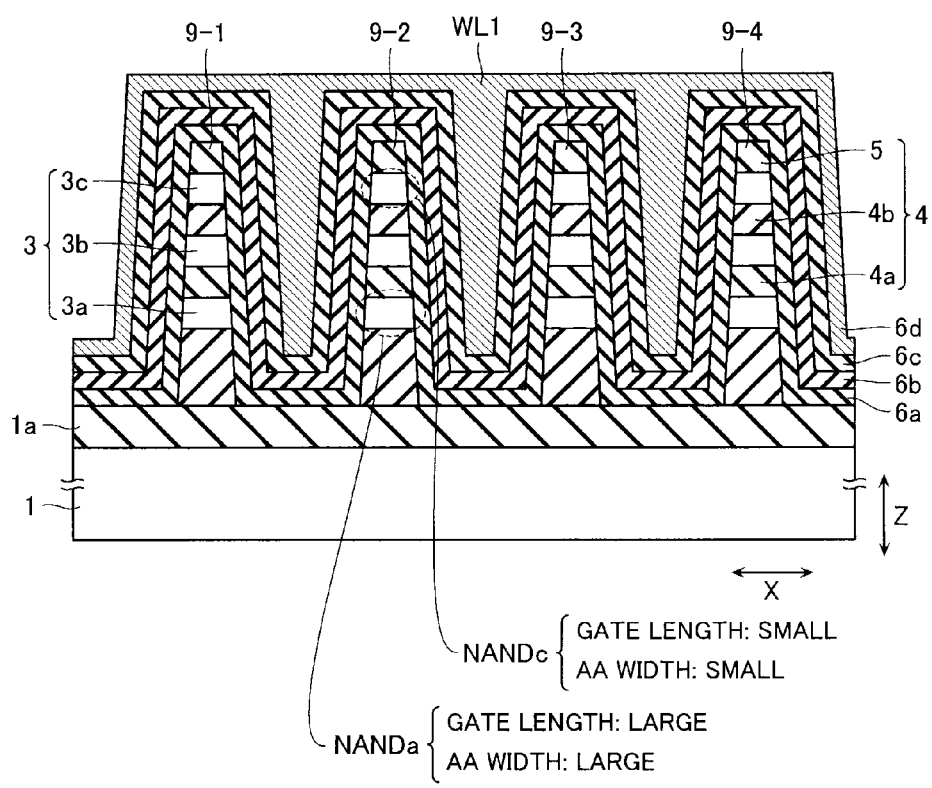
FIG. 10 is a cross-sectional view along the X-axis direction of the non-volatile semiconductor memory device according to the first embodiment.

Meanwhile, in FIG. 1A to FIG. 5, for ease of illustration, the gate stack structure such as the word lines WL is shown to have a rectangular shape in which the line width is consistent in the vertical direction (FIG. 1A). Also, the fin-type stack structures 9-1 to 9-4 are shown to have a rectangular shape that has a wall surface perpendicular to the surface of the semiconductor substrate 1 (see FIG. 4). However, in actual devices, as shown in FIG. 9, the gate stack structure often has, for example, a forward tapered shape (a reverse tapered shape in some manufacturing methods) in which the line width increases from the upper to lower layers in the Y-Z plane. Also, with reference to FIG. 10, the fin-type stack structures 9-1 to 9-4 also have, when using usual semiconductor processes, a forward tapered shape in which their width increases from the upper to lower layers in the X-Z plane.

In this way, if the gate stack structures, particularly the word lines WL, have a forward tapered shape and the fin-type stack structures 9-1 to 9-4 also have a forward tapered shape, in the upper-layer memory string NANDc (the semiconductor layer 3c), the word lines WL have a small width and the semiconductor layer 3c has a small width, and thus the gate length is small and the channel portion has a small width (active area width). Meanwhile, in the lower-layer memory string NANDa (the semiconductor layer 3a), the word lines WL have a large width and the semiconductor layer 3a has a large width, and thus the gate length is large and the channel portion has a large width (active area width). The difference of the gate length and the active area width in the stacking direction may cause different characteristics of the memory cells (including the short channel effects) in the stacking direction.

Figure 11A:
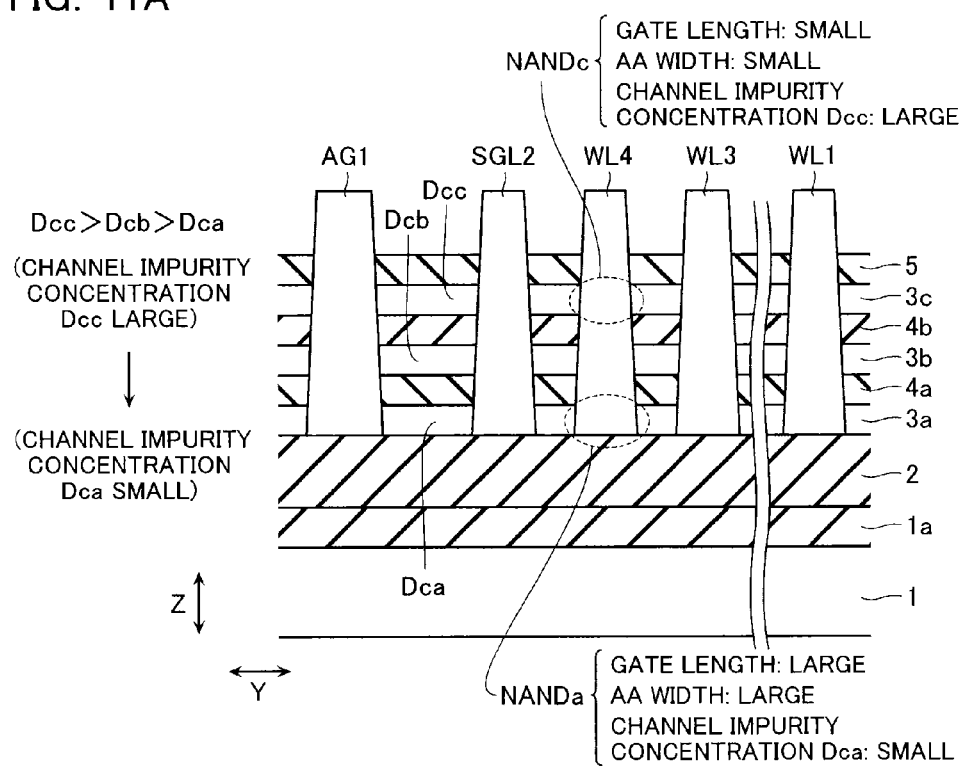
FIG. 11A is a cross-sectional view illustrating a configuration of the non-volatile semiconductor memory device according to the first embodiment.

In this embodiment, therefore, with reference to FIG. 11A, the semiconductor layers 3a to 3c are manufactured so that the channel impurity concentration in the memory cells in the semiconductor layers 3a to 3c in the fin-type stack structures 9-1 to 9-4 decrease from the upper to lower layers (the channel impurity concentration is higher in the upper semiconductor layers). Specifically, if the semiconductor layers 3a to 3c comprise a p-type semiconductor, the p-type impurities in the channel portions in the semiconductor layers 3a to 3c have impurity concentrations Dcc, Dcb, and Dca of Dcc>Dcb>Dca.

In the upper semiconductor layer 3c, the gate length is small and the active area width is small, and thus the memory cells are more likely to encounter the short channel effects than those in the lower semiconductor layer 3a (if the other characteristics are the same). However, this embodiment provides the channel impurity concentrations Dcc, Dcb, and Dca of Dcc>Dcb>Dca as described above. Therefore, in the upper semiconductor layer 3c, the threshold voltage Vth in the memory cells MC increases, thus reducing the short channel effects generated in the upper semiconductor layer 3c. Therefore, according to the configuration in the first embodiment, regardless of the difference of the gate length and the active area width caused by the taper shape as described above, the characteristics of the memory cells may be uniformed in the stacking direction.

Figure 11B:
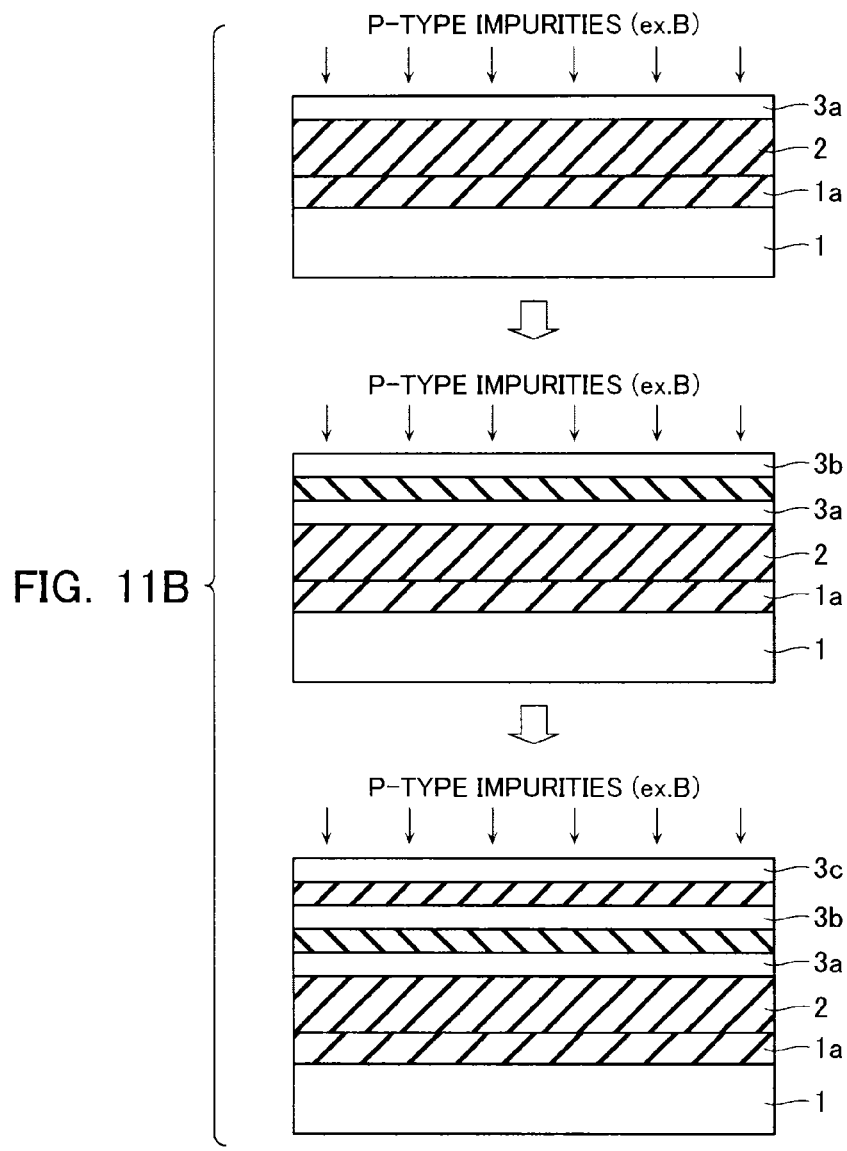
FIG. 11B is a process chart illustrating a method of manufacturing the non-volatile semiconductor memory device according to the first embodiment.

Note that the semiconductor layers 3a, 3b, and 3c having different impurity concentrations in the channel portions may be formed in the following way. For example, with reference to FIG. 11B, the semiconductor layers 3a, 3b, and 3c may be formed by sequential deposition of them, and an ion implantation, during the deposition of each layer, from above the surface of each layer. Then the amount of the ion implantation may be changed to form the semiconductor layers 3a to 3c of different impurity concentrations as described above.

Figure 11C:
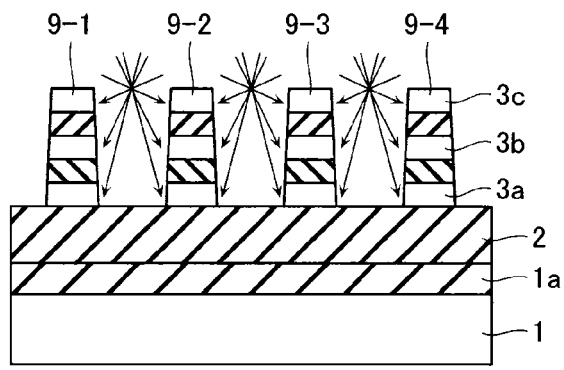
FIG. 11C is a process chart illustrating a method of manufacturing the non-volatile semiconductor memory device according to the first embodiment.

Alternatively, with reference to FIG. 11C, after the fin-type stack structures 9-1 to 9-4 are formed, ions may be implanted at an angle into the side surfaces of the fin-type stack structures 9-1 to 9-4 to implant the impurities. In the angled ion implantation, more ions are implanted into the semiconductor layer 3c above the fin-type stack structures 9-1 to 9-4 and less ions are implanted into the semiconductor layer 3a below the stack structures. Therefore, the semiconductor layers 3a to 3c may have different impurity concentrations.

[Second Embodiment]

Figure 12:
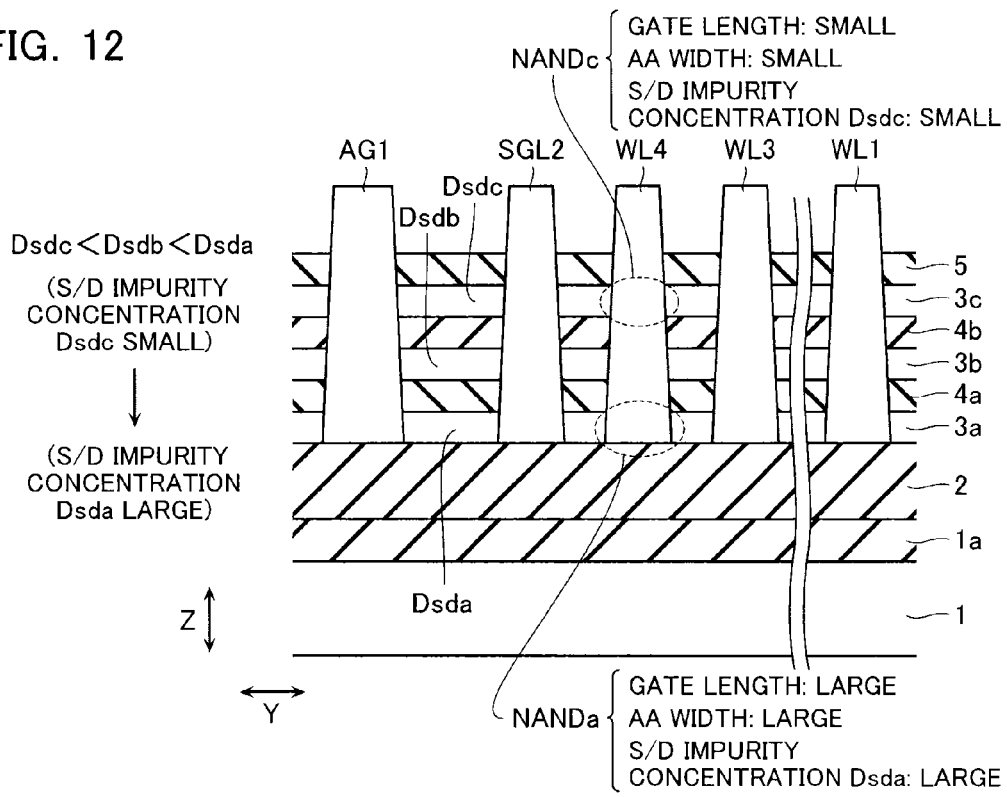
FIG. 12 is a cross-sectional view illustrating a configuration of a non-volatile semiconductor memory device according to a second embodiment.

With reference next to FIG. 12, a non-volatile semiconductor memory device according to a second embodiment will be described. The non-volatile semiconductor memory device in the second embodiment has a schematic configuration similar to that of the device in the first embodiment (FIG. 1A to FIG. 5).

FIG. 12 is a cross-sectional view along the Y-axis direction of the non-volatile semiconductor memory device according to the second embodiment. In the non-volatile semiconductor memory device in the second embodiment, as in the first embodiment, the gate stack structures, particularly the word lines WL, have a forward tapered shape and the fin-type stack structures 9-1 to 9-4 also have a forward tapered shape. Therefore, in the upper-layer memory string NANDc (the semiconductor layer 3c), the word lines WL have a small width and the semiconductor layer 3c has a small width, and thus the gate length is small and the channel portion has a small width (active area width). Meanwhile, in the lower-layer memory string NANDa, the word lines WL have a large width and the semiconductor layer 3a has a large width, and thus the gate length is small and the channel portion has a large width (active area width).

In this embodiment, therefore, with reference to FIG. 12, the semiconductor layers 3a to 3c in the fin-type stack structures 9-1 to 9-4 are configured so that the impurity concentration in the sources/drains of the memory cells in the semiconductor layers 3a to 3c increases from the upper to lower layers. Specifically, if the semiconductor layers 3a to 3c comprise a p-type semiconductor, the n-type impurities (such as phosphorus (P)) of the sources/drains of the memory cells in the semiconductor layers 3a to 3c have impurity concentrations Dsdc, Dsdb, and Dsda of Dsdc<Dsdb<Dsda. Note that the impurity concentration of the p-type impurities in the channel portions of the memory cells in the semiconductor layers 3a to 3c may be the same between the semiconductor layers 3a to 3c. Note, however, that the p-type impurity concentration in the channel portions may be different in the stacking direction.

In the upper semiconductor layer 3c, the gate length is small and the active area is small, and thus the memory cells are more likely to encounter the short channel effects than those in the lower semiconductor layer 3a. However, in this embodiment, the sources/drains have impurity concentrations Dsdc, Dsdb, and Dsda of Dsdc<Dsdb<Dsda, as described above. Therefore, in the upper semiconductor layer 3c, the threshold voltage Vth in the memory cells MC increases, thus reducing the short channel effects generated in the upper semiconductor layer 3c. Therefore, according to the configuration of the second embodiment, the characteristics of the memory cells may be uniformed in the stacking direction.

[Third Embodiment]

Figure 13:
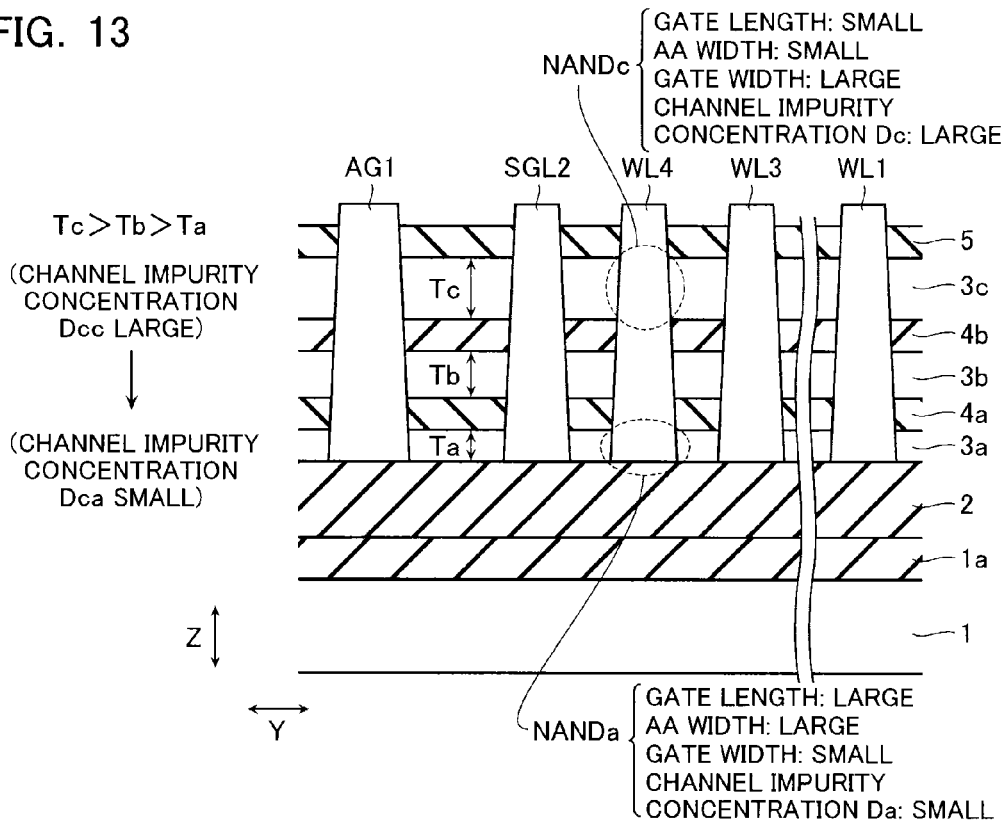
FIG. 13 is a cross-sectional view illustrating a configuration of a non-volatile semiconductor memory device according to a third embodiment.

With reference next to FIG. 13, a non-volatile semiconductor memory device according to a third embodiment will be described. The non-volatile semiconductor memory device in the third embodiment has a schematic configuration similar to that of the device in the first embodiment (FIG. 1A to FIG. 5).

FIG. 13 is a cross-sectional view along the Y-axis direction of the non-volatile semiconductor memory device according to the third embodiment. In the non-volatile semiconductor memory device according to the third embodiment, as in the first embodiment, the gate stack structures, particularly the word lines WL, have a forward tapered shape and the fin-type stack structures 9-1 to 9-4 also have a forward tapered shape.

In the non-volatile semiconductor memory device according to the third embodiment, the semiconductor layers 3a to 3c are configured so that the film thickness T in the stacking direction (Z-direction) of the semiconductor layers 3a to 3c increases from the lower to upper layers (the film thickness T in the stacking direction is larger in the upper semiconductor layers). Specifically, the semiconductor layers 3a to 3c have film thicknesses Ta to Tc in the Z-direction of Tc>Tb>Ta.

Further, in the third embodiment, the semiconductor layers 3a to 3c are formed so that the channel impurity concentration in the memory cells in the semiconductor layers 3a to 3c decreases from the upper to lower layers. Specifically, if the semiconductor layers 3a to 3c comprise a p-type semiconductor, the p-type impurities in the channel portions in the semiconductor layers 3a to 3c have impurity concentrations Dcc, Dcb, and Dca of Dcc>Dcb>Dca.

Figure 14:
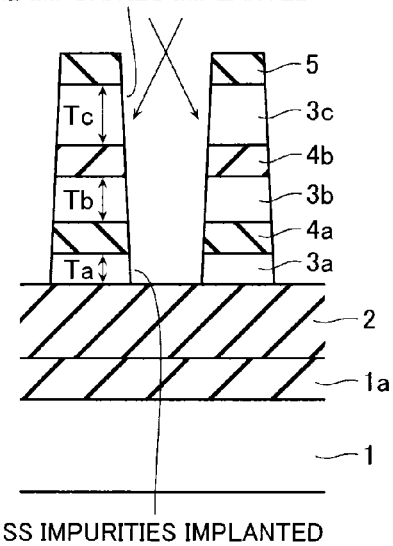
FIG. 14 is a process chart illustrating a method of manufacturing the non-volatile semiconductor memory device according to the third embodiment.

With reference to FIG. 14, given that the semiconductor layers 3a to 3c have film thicknesses Ta to Tc of Tc>Tb>Ta, and when the p-type impurities are oblique-ion implanted into the fin-type stack structures 9-1 to 9-4, more impurities are implanted into the upper semiconductor layer 3c and conversely less impurities are implanted into the lower semiconductor layer 3a. Therefore, the relationship of Dcc>Dcb>Dca is provided as described above.

In the upper semiconductor layer 3c, the gate length is small and the active area width is small, and thus the memory cells are more likely to encounter the short channel effects than those in the lower semiconductor layer 3a. However, in this embodiment, the channels have impurity concentrations Dcc, Dcb, and Dca of Dcc>Dcb>Dca, as described above. Therefore, in the upper semiconductor layer 3c, the threshold voltage Vth in the memory cells MC increases, thus reducing the short channel effects generated in the upper semiconductor layer 3c. Therefore, according to the configuration of the third embodiment, the characteristics of the memory cells may be uniformed in the stacking direction.

[Fourth Embodiment]

Figure 15:
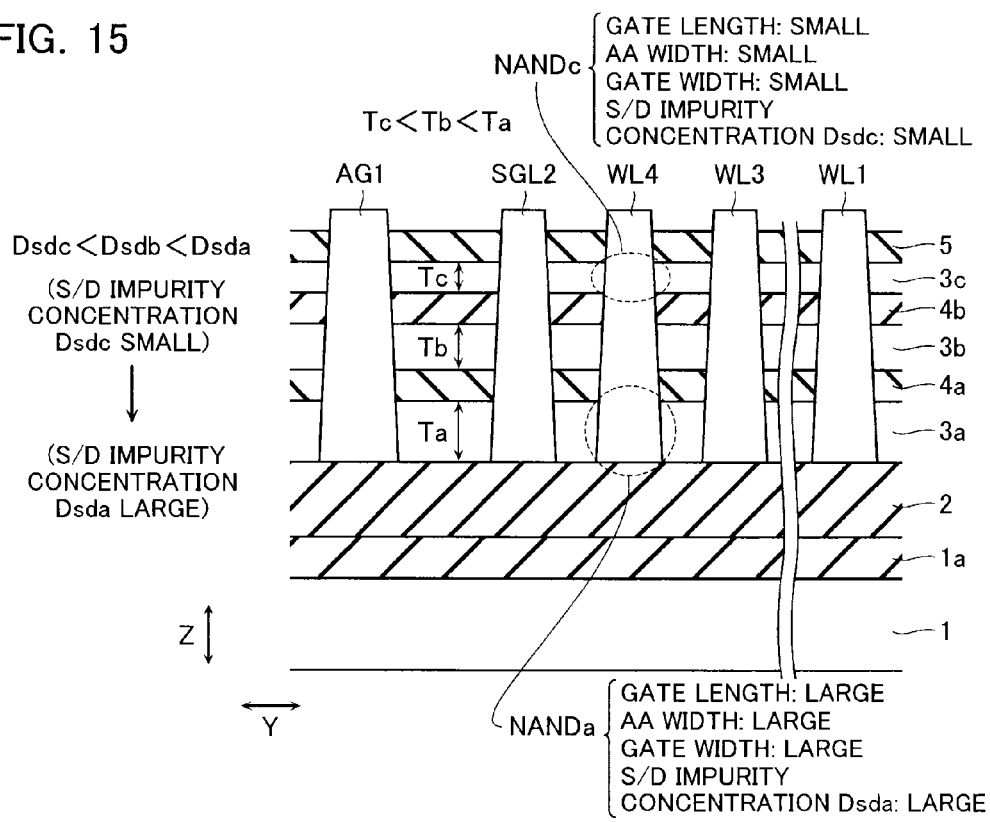
FIG. 15 is a cross-sectional view illustrating a configuration of a non-volatile semiconductor memory device according to a fourth embodiment.

With reference next to FIG. 15, a non-volatile semiconductor memory device according to a fourth embodiment will be described. The non-volatile semiconductor memory device in the fourth embodiment has a schematic configuration similar to that of the device in the first embodiment (FIG. 1A to FIG. 5).

FIG. 15 is a cross-sectional view along the Y-axis direction of the non-volatile semiconductor memory device according to the fourth embodiment. In the non-volatile semiconductor memory device according to the fourth embodiment, as in the first embodiment, the gate stack structures, particularly the word lines WL, have a forward tapered shape and the fin-type stack structures 9-1 to 9-4 also have a forward tapered shape. Therefore, in the upper-layer memory string NANDc, the word lines WL have a small width and the semiconductor layer 3c has a small width, and thus the gate length is small and the channel portion has a small width (active area width). Meanwhile, in the lower-layer memory string NANDa, the word lines WL have a large width and the semiconductor layer 3a has a large width, and thus the gate length is large and the channel portion has a large width (active area width).

Therefore, in the non-volatile semiconductor memory device of the fourth embodiment, the semiconductor layers 3a to 3c are configured so that the film thickness T in the stacking direction (Z-direction) of the semiconductor layers 3a to 3c increases from the upper to lower layers. Specifically, the semiconductor layers 3a to 3c have film thicknesses Ta to Tc in the Z-direction of Tc<Tb<Ta.

Further, in the fourth embodiment, the semiconductor layers 3a to 3c are configured so that the impurity concentration in the sources/drains in the memory cells in the semiconductor layers 3a to 3c increases from the upper to lower layers. Specifically, if the semiconductor layers 3a to 3c comprise a p-type semiconductor, the n-type impurities in the sources/drains of the memory cells in the semiconductor layers 3a to 3c have impurity concentrations Dsdc, Dsdb, and Dsda of Dsdc<Dsdb<Dsda.

Figure 16:
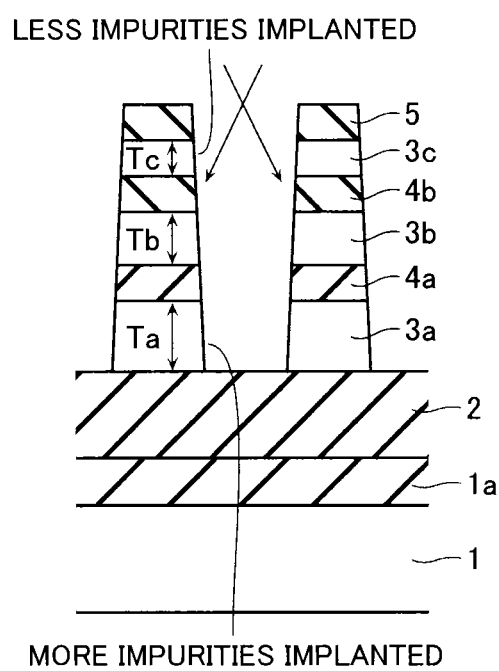
FIG. 16 is a process chart illustrating a method of manufacturing the non-volatile semiconductor memory device according to the fourth embodiment.

With reference to FIG. 16, given that the semiconductor layers 3a to 3c have film thicknesses Ta to Tc of Tc<Tb<Ta, and when the n-type impurities (such as phosphorus (P)) are oblique-ion implanted into the fin-type stack structures 9-1 to 9-4 to form the source/drain, less impurities are implanted into the upper semiconductor layer 3c and conversely more impurities are implanted into the lower semiconductor layer 3a. Therefore, the relationship of Dsdc<Dsdb<Dsda is provided as described above.

In the upper semiconductor layer 3c, the gate length is small and the active area width is small, and thus the memory cells are more likely to encounter the short channel effects than those in the lower semiconductor layer 3a. However, in this embodiment, the sources/drains of the semiconductor layers 3a to 3c have impurity concentrations Dsdc, Dsdb, and Dsda of Dsdc<Dsdb<Dsda, as described above. Therefore, in the upper semiconductor layer 3c, the threshold voltage Vth in the memory cells MC increases, thus reducing the short channel effects generated in the upper semiconductor layer 3c. Therefore, according to the configuration of the fourth embodiment, the characteristics of the memory cells may be uniformed in the stacking direction.

[Fifth Embodiment]

Figure 17:
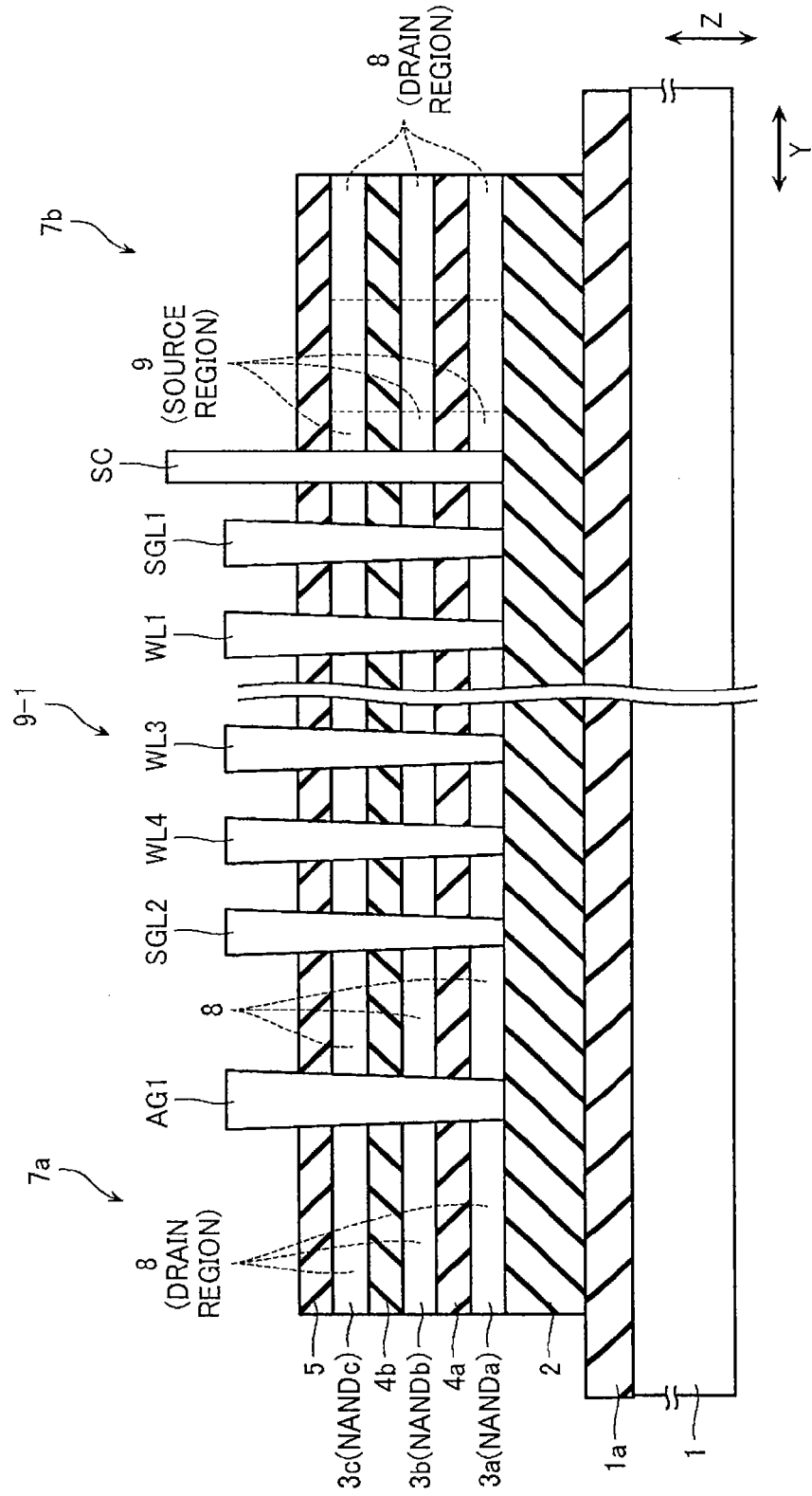
FIG. 17 is a cross-sectional view along the Y-axis direction of a schematic configuration of a non-volatile semiconductor memory device according to a fifth embodiment.
Figure 18:
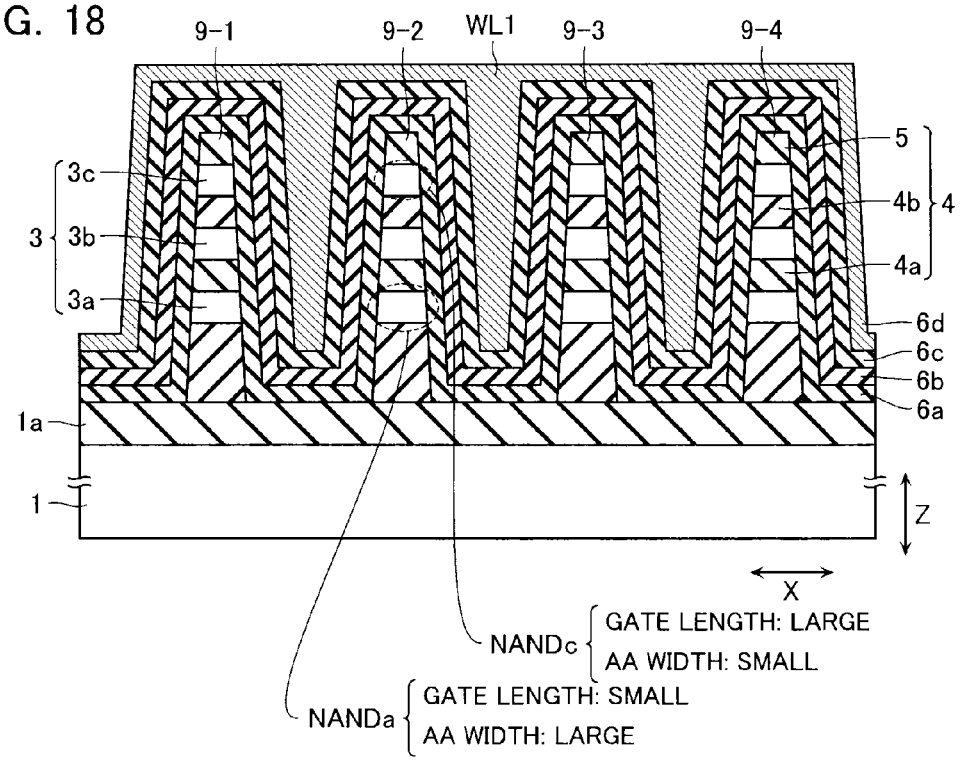
FIG. 18 is a cross-sectional view along the X-axis direction of the schematic configuration of the non-volatile semiconductor memory device according to the fifth embodiment.
Figure 19:
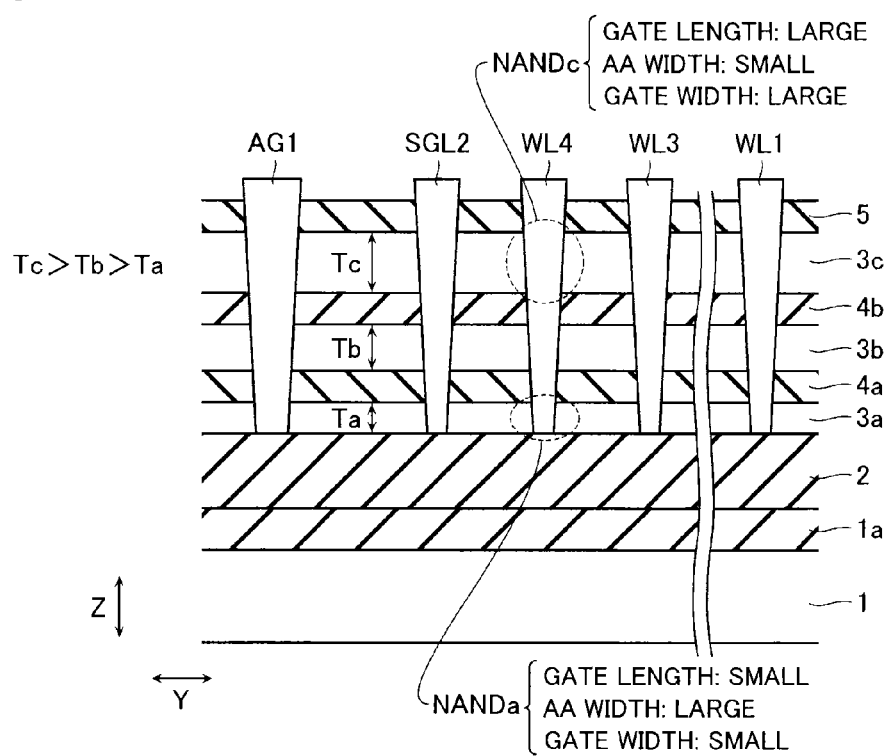
FIG. 19 is a cross-sectional view illustrating a configuration of the non-volatile semiconductor memory device according to the fifth embodiment.

With reference next to FIG. 17 to FIG. 19, a non-volatile semiconductor memory device according to a fifth embodiment will be described. The non-volatile semiconductor memory device in the fifth embodiment has a schematic configuration similar to that of the device in the first embodiment (FIG. 1A to FIG. 5). FIG. 17 is a cross-sectional view along the Y-axis direction of the non-volatile semiconductor memory device according to the fifth embodiment. FIG. 18 is a cross-sectional view along the X-axis direction of the non-volatile semiconductor memory device according to the fifth embodiment.

In the non-volatile semiconductor memory device according to the fifth embodiment, unlike those in the above first to fifth embodiments, the gate stack structures, particularly the word lines WL, have a reverse taper shape (see FIG. 17). Meanwhile, with reference to FIG. 18, the fin-type stack structures 9-1 to 9-4 have a forward tapered shape similar to those in the first to fourth embodiments.

Therefore, in the upper-layer memory string NANDc, the word lines WL have a large width and thus the gate length is large, while the semiconductor layer 3*c* has a small width and thus the channel portion has a small width (active area width). Meanwhile, in the lower-layer memory string NANDa, the word lines WL have a small width, and thus the gate length is small, while the channel portion has a large width (active area width). Therefore, when the memory cells are rendered conductive, the cell current Icell through the upper-layer memory string NANDc is smaller than that through the lower-layer memory string NANDa. If a large difference occurs in the cell current Icell, the read operation from the memory cell array may encounter misreading or the like. Also, the lower-layer memory string NANDa is more likely to encounter the short channel effects.

In this embodiment, therefore, with reference to FIG. 19, the semiconductor layers 3*a* to 3*c* are configured so that the film thickness in the stacking direction (Z-direction) of the semiconductor layers 3*a* to 3*c* increases from the lower to upper layers. Specifically, the semiconductor layers 3*a* to 3*c* have film thicknesses Ta to Tc in the Z-direction of Tc>Tb>Ta.

With the above film thickness relationship of Tc>Tb>Tc, the cell current Icell may remain constant between the memory strings 3*a* to 3*c* in the stacking direction. Also, the short channel effects in the lower-layer memory string NANDa may be reduced.

[Sixth Embodiment]

Figure 20:
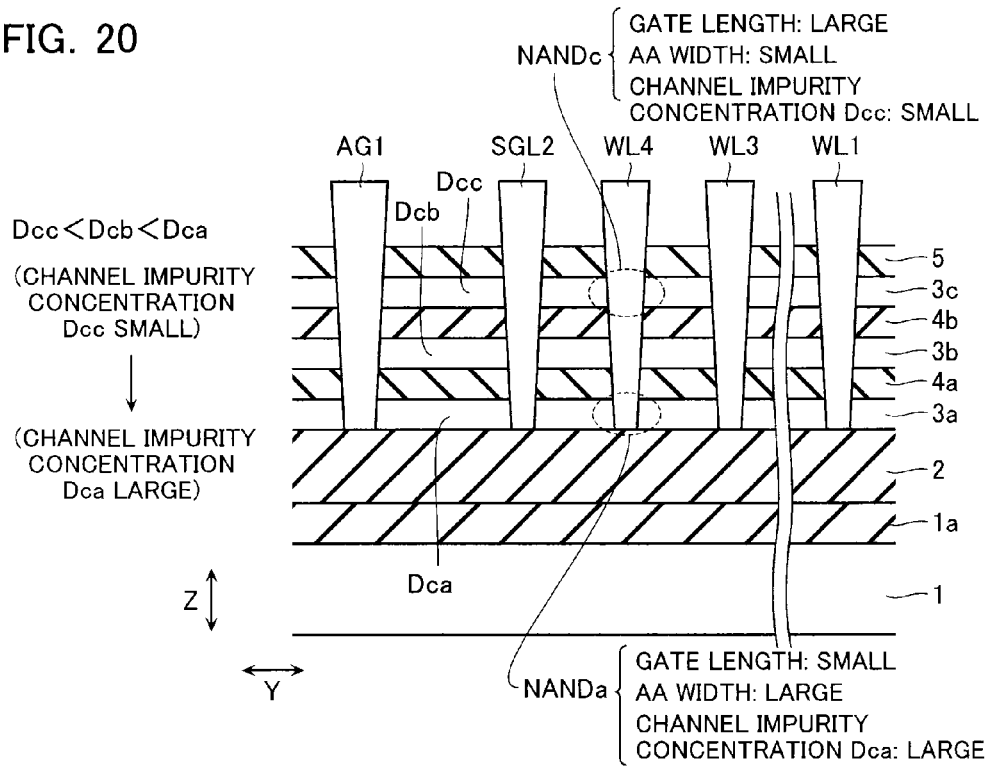
FIG. 20 is a cross-sectional view illustrating a configuration of a non-volatile semiconductor memory device according to a sixth embodiment.

With reference next to FIG. 20, a non-volatile semiconductor memory device according to a sixth embodiment will be described. The non-volatile semiconductor memory device in the sixth embodiment has a schematic configuration similar to that of the device in the first embodiment (FIG. 1A to FIG. 5). FIG. 20 is a cross-sectional view along the Y-axis direction of the non-volatile semiconductor memory device according to the sixth embodiment.

In the non-volatile semiconductor memory device according to the sixth embodiment, as in the fifth embodiment, the gate stack structures, particularly the word lines WL, have a reverse taper shape, while the fin-type stack structures 9-1 to 9-4 have a forward tapered shape. Therefore, in the upper-layer memory string NANDc, the gate length is large, while the channel portion has a small width (active area width). Meanwhile, in the lower-layer memory string NANDa, the gate length is small, while the channel portion has a large width (active area width).

Then, in the sixth embodiment, with reference to FIG. 20, the semiconductor layers 3*a* to 3*c* are configured so that the channel impurity concentration Dc in the memory cells in the semiconductor layers 3*a* to 3*c* increases from the upper to lower layers. Specifically, if the semiconductor layers 3*a* to 3*c* comprise a p-type semiconductor, the p-type impurities (such as phosphorus (P)) in the channel portions in the semiconductor layers 3*a* to 3*c* have impurity concentrations Dcc, Dcb, and Dca of Dcc<Dcb<Dca.

In the upper semiconductor layer 3*c*, the gate length is large, while the active area width is small, and thus the cell current Icell tends to be smaller than that in the lower semiconductor layer 3*a*. However, this embodiment provides channel impurity concentrations Dcc, Dcb, and Dca of Dcc<Dcb<Dca, as described above. Therefore, the cell current Icell may be uniformed in the stacking direction. Also, the short channel effects may be uniformed in the stacking direction.

[Seventh Embodiment]

Figure 21:
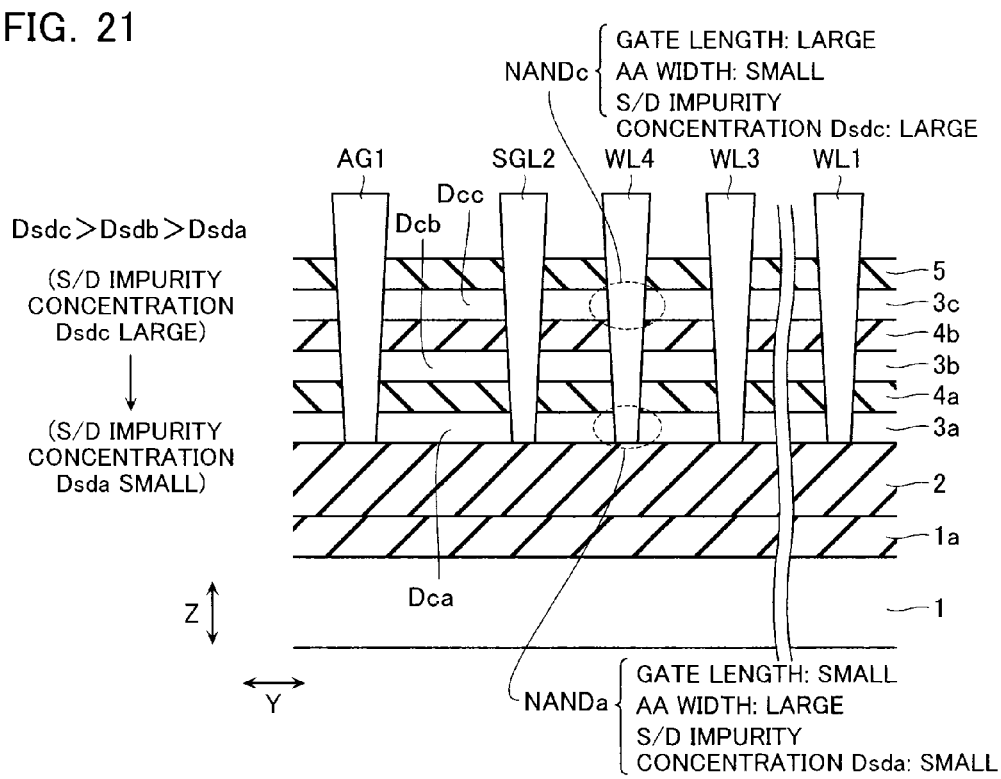
FIG. 21 is a cross-sectional view illustrating a configuration of a non-volatile semiconductor memory device according to a seventh embodiment.

With reference next to FIG. 21, a non-volatile semiconductor memory device according to a seventh embodiment will be described. The non-volatile semiconductor memory device in the seventh embodiment has a schematic configuration similar to that of the device in the first embodiment (FIG. 1A to FIG. 5). FIG. 21 is a cross-sectional view along the Y-axis direction of the non-volatile semiconductor memory device according to the seventh embodiment.

In the non-volatile semiconductor memory device according to the seventh embodiment, as in the fifth embodiment, the gate stack structures, particularly the word lines WL, have a reverse taper shape, while the fin-type stack structures 9-1 to 9-4 have a forward tapered shape.

In the seventh embodiment, with reference to FIG. 21, the semiconductor layers 3*a* to 3*c* are configured so that the impurity concentration Dsd in the sources/drains in the memory cells in the semiconductor layers 3*a* to 3*c* decreases from the upper to lower layers (Dsd is higher in the upper semiconductor layers). Specifically, if the semiconductor layers 3*a* to 3*c* comprise a p-type semiconductor, the n-type impurities (such as phosphorus (P)) in the sources/drains in the memory cells in the semiconductor layers 3*a* to 3*c* have impurity concentrations Dsdc, Dsdb, and Dsda of Dsdc>Dsdb>Dsda. Therefore, as in the sixth embodiment, the cell current Icell may be uniformed in the stacking direction. Also, the short channel effects may be uniformed in the stacking direction.

[Eighth Embodiment]

Figure 22:
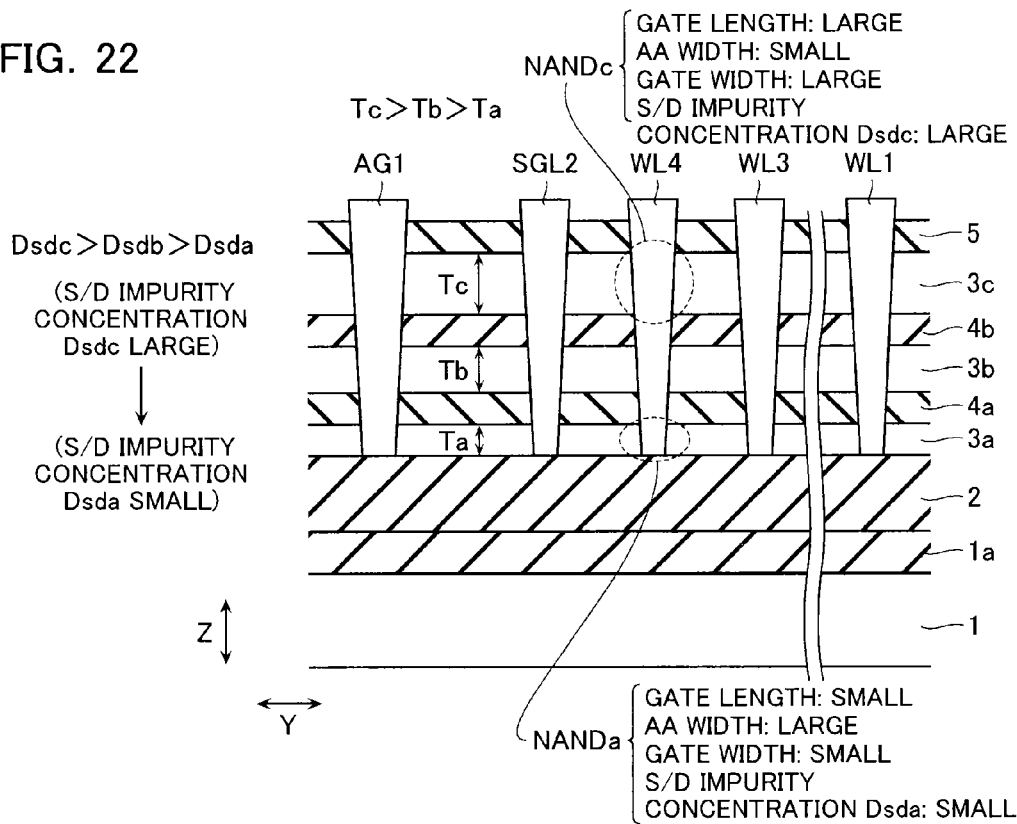
FIG. 22 is a cross-sectional view illustrating a configuration of a non-volatile semiconductor memory device according to an eighth embodiment.

With reference next to FIG. 22, a non-volatile semiconductor memory device according to an eighth embodiment will be described. The non-volatile semiconductor memory device in the eighth embodiment has a schematic configuration similar to that of the device in the first embodiment (FIG. 1A to FIG. 5). FIG. 22 is a cross-sectional view along the Y-axis direction of the non-volatile semiconductor memory device according to the eighth embodiment.

In the non-volatile semiconductor memory device according to the eighth embodiment, as in the fifth embodiment, the gate stack structures, particularly the word lines WL, have a reverse taper shape, while the fin-type stack structures 9-1 to 9-4 have a forward tapered shape.

In the non-volatile semiconductor memory device of the eighth embodiment, the semiconductor layers 3*a* to 3*c* are configured so that the film thickness T in the stacking direction (Z-direction) of the semiconductor layers 3*a* to 3*c* increases from the lower to upper layers. Specifically, the semiconductor layers 3*a* to 3*c* have film thicknesses Ta to Tc in the Z-direction of Tc>Tb>Ta.

Further, in the eighth embodiment, the semiconductor layers 3*a* to 3*c* are formed so that the impurity concentration Dsd in the sources/drains of the memory cells in the semiconductor layers 3*a* to 3*c* decreases from the upper to lower layers. Specifically, if the semiconductor layers 3*a* to 3*c* comprise a p-type semiconductor, the n-type impurities in the sources/drains in the memory cells in the semiconductor layers 3*a* to 3*c* have impurity concentrations Dsdc, Dsdb, and Dsda of Dsdc>Dsdb>Dsda.

Figure 23:
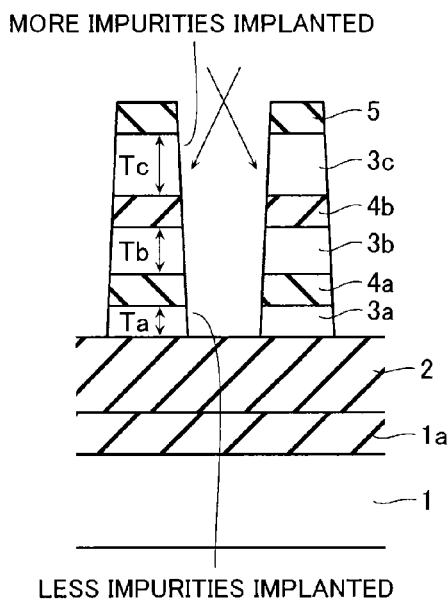
FIG. 23 a process chart illustrating a method of manufacturing the non-volatile semiconductor memory device according to the eighth embodiment.

With reference to FIG. 23, given that the semiconductor layers 3a to 3c have film thicknesses Ta to Tc of Tc>Tb>Ta, and when the n-type impurities (such as phosphorus) are oblique-ion implanted into the fin-type stack structures 9-1 to 9-4 to form the source/drain of the memory cell, more impurities are implanted into the upper semiconductor layer 3c and conversely less impurities are implanted into the lower semiconductor layer 3a. Therefore, the relationship of Dsdc>Dsdb>Dsda is provided as described above.

In the upper semiconductor layer 3c, the gate length is large, while the active area width is small, and thus the cell current Icell tends to be smaller than that in the lower semiconductor layer 3a. However, in this embodiment, the sources/drains have impurity concentrations Dsdc, Dsdb, and Dsda of Dsdc>Dsdb>Dsda, as described above. Therefore, the cell current Icell may be uniformed in the stacking direction. Also, the short channel effects may be uniformed in the stacking direction.

While certain embodiments of the invention have been described, these embodiments have been presented by way of example only, and are not intended to limit the scope of the invention. The novel embodiments may be embodied in a variety of other forms, and various omissions, substitutions, and changes may be made without departing from the spirit of the invention. The embodiments and variants thereof fall within the scope and abstract of the invention and also fall within the invention of the accompanying claims and its equivalents.

What is claimed is:

1. A non-volatile semiconductor memory device comprising:
   a semiconductor substrate;
   stack structures arranged in a first direction horizontal to a surface of the semiconductor substrate, one of the stack structures having a longitudinal direction, the longitudinal direction being a second direction horizontal to the surface of the semiconductor substrate and crossing the first direction, one of the stack structures having a plurality of semiconductor layers functioning as a channel of a memory cell, the semiconductor layers being stacked between interlayer insulating layers in a third direction perpendicular to the first and second directions, and the semiconductor layers having a longitudinal direction in the second direction;
   a memory film provided on side surfaces on the first direction of the stack structures, the memory film comprising a charge accumulation film of the memory cell; and
   conductive films provided on side surfaces on the first direction of the stack structures via the memory film, the conductive films functioning as control electrodes of the memory cell,
   one of the stack structures having a shape increasing in width from a side away from the semiconductor substrate to the semiconductor substrate in a cross-section comprising the first and third directions,
   one of the conductive films having a shape increasing in width from the side away from the semiconductor substrate to the semiconductor substrate in a cross-section comprising the second and third directions, and
   predetermined portions in the semiconductor layers having different impurity concentrations between upper and lower semiconductor layers.

2. The device according to claim 1, wherein
   in the semiconductor layers, portions forming the channel of the memory cell have an impurity concentration higher in upper semiconductor layers.

3. The device according to claim 1, wherein
   in a plurality of semiconductor layers included in one stack structure, the thickness in the third direction is larger in upper semiconductor layers.

4. The device according to claim 2, wherein
   in a plurality of semiconductor layers included in one stack structure, the thickness in the third direction is larger in upper semiconductor layers.

5. The device according to claim 1, wherein
   in the semiconductor layers, portions forming sources/drains of the memory cell have an impurity concentration higher in lower semiconductor layers.

6. The device according to claim 1, wherein
   in a plurality of semiconductor layers included in one stack structure, the thickness in the third direction is larger in lower semiconductor layers.

7. The device according to claim 5, wherein
   in a plurality of semiconductor layers included in one stack structure, the thickness in the third direction is larger in lower semiconductor layers.

8. The device according to claim 1, wherein
   the conductive films have a comb-blade shape, and comb-blade portions thereof each extends in the third direction.

9. The device according to claim 1, wherein each of the semiconductor layers includes a memory string having a plurality of memory cells connected in series.

10. A non-volatile semiconductor memory device comprising:
    a semiconductor substrate;
    stack structures arranged in a first direction horizontal to a surface of the semiconductor substrate, one of the stack structures having a longitudinal direction, the longitudinal direction being a second direction horizontal to the surface of the semiconductor substrate and crossing the first direction, one of the stack structures having a plurality of semiconductor layers functioning as a channel of a memory cell, the semiconductor layers being stacked between interlayer insulating layers in a third direction perpendicular to the first and second directions, and the semiconductor layers having a longitudinal direction in the second direction;
    a memory film provided on side surfaces on the first direction of the stack structures, the memory film comprising a charge accumulation film of the memory cell; and
    conductive films provided on side surfaces on the first direction of the stack structures via the memory film, the conductive films functioning as control electrodes of the memory cell,
    one of the stack structures having a shape increasing in width from a side away from the semiconductor substrate to the semiconductor substrate in a cross-section comprising the first and third directions,
    one of the conductive films having a shape decreasing in width from the side away from the semiconductor substrate to the semiconductor substrate in a cross-section comprising the second and third directions, and
    in a plurality of semiconductor layers included in one stack structure, the thickness of a semiconductor layer in the third direction being larger in upper layers that are further from the semiconductor substrate.

11. The according to claim 10, wherein
    in the semiconductor layers, portions forming sources/drains of the memory cell have an impurity concentration lower in lower semiconductor layers.

12. The device according to claim 10, wherein
the conductive films have a comb-blade shape, and comb-blade portions thereof each extends in the third direction.

13. The device according to claim 10, wherein each of the semiconductor layers includes a memory string having a plurality of memory cells connected in series.

14. A non-volatile semiconductor memory device comprising:
a semiconductor substrate;
stack structures arranged in a first direction horizontal to a surface of the semiconductor substrate, one of the stack structures having a longitudinal direction, the longitudinal direction being a second direction horizontal to the surface of the semiconductor substrate and crossing the first direction, one of the stack structures having a plurality of semiconductor layers functioning as a channel of a memory cell, the semiconductor layers being stacked between interlayer insulating layers in a third direction perpendicular to the first and second directions, and the semiconductor layers having a longitudinal direction in the second direction;
a memory film provided on side surfaces on the first direction of the stack structures, the memory film comprising a charge accumulation film of the memory cell; and
conductive films provided on side surfaces on the first direction of the stack structures via the memory film, the conductive films functioning as control electrodes of the memory cell,
one of the stack structures having a shape increasing in width from a side away from the semiconductor substrate to the semiconductor substrate in a cross-section comprising the first and third directions,
one of the conductive films having a shape decreasing in width from the side away from the semiconductor substrate to the semiconductor substrate in a cross-section comprising the second and third directions, and
predetermined portions in the semiconductor layers having different impurity concentrations between upper and lower semiconductor layers.

15. The device according to claim 14, wherein
in the semiconductor layers, portions forming the channel of the memory cell have an impurity concentration higher in lower semiconductor layers.

16. The device according to claim 14, wherein
in the semiconductor layers, portions forming sources/drains of the memory cell have an impurity concentration higher in upper semiconductor layers.

17. The device according to claim 14, wherein
the conductive films have a comb-blade shape, and comb-blade portions thereof each extends in the third direction.

18. The device according to claim 14, wherein each of the semiconductor layers includes a memory string having a plurality of memory cells connected in series.

* * * * *